(12) United States Patent
Hosono et al.

(10) Patent No.: US 11,495,767 B2
(45) Date of Patent: Nov. 8, 2022

(54) PHOTOELECTRONIC DEVICE, FLAT PANEL DISPLAY USING THE SAME, AND FABRICATION METHOD OF PHOTOELECTRONIC DEVICE

(71) Applicant: TOKYO INSTITUTE OF TECHNOLOGY, Tokyo (JP)

(72) Inventors: Hideo Hosono, Tokyo (JP); Junghwan Kim, Tokyo (JP); Hideya Kumomi, Tokyo (JP)

(73) Assignee: TOKYO INSTITUTE OF TECHNOLOGY, Tokyo (JP)

( * ) Notice: Subject to any disclaimer, the term of this patent is extended or adjusted under 35 U.S.C. 154(b) by 181 days.

(21) Appl. No.: 17/130,403

(22) Filed: Dec. 22, 2020

(65) Prior Publication Data

US 2021/0151710 A1    May 20, 2021

Related U.S. Application Data

(63) Continuation of application No. PCT/JP2019/023604, filed on Jun. 14, 2019.

(30) Foreign Application Priority Data

Jul. 2, 2018 (JP) .............................. JP2018-126332

(51) Int. Cl.
*H01L 51/52* (2006.01)
*H01L 27/32* (2006.01)
(Continued)

(52) U.S. Cl.
CPC ...... *H01L 51/5215* (2013.01); *H01L 27/3244* (2013.01); *H01L 51/442* (2013.01);
(Continued)

(58) Field of Classification Search
CPC .............. H01L 51/5215; H01L 51/442; H01L 51/5234
See application file for complete search history.

(56) References Cited

U.S. PATENT DOCUMENTS

2008/0252208 A1  10/2008  Winters et al.
2011/0005591 A1   1/2011  Buller et al.
(Continued)

FOREIGN PATENT DOCUMENTS

CN    108832012    11/2018
JP    2012-533187  12/2012
(Continued)

OTHER PUBLICATIONS

Extended European Search Report dated Mar. 2, 2022 issued with respect to the corresponding European Patent Application No. 19830639.1.
(Continued)

*Primary Examiner* — Anthony Ho
(74) *Attorney, Agent, or Firm* — IPUSA, PLLC

(57) ABSTRACT

A photoelectronic device includes an active layer containing inorganic particles, and an oxide semiconductor layer containing zinc (Zn), silicon (Si), and oxygen (O), where the oxide semiconductor layer and the active layer are stacked layers. The photoelectronic device further includes a multilayer transparent electrode over or under the active layer, wherein the oxide semiconductor layer serves as a part of the multilayer transparent electrode.

19 Claims, 26 Drawing Sheets

(51) Int. Cl.
  *H01L 51/44* (2006.01)
  *H01L 51/50* (2006.01)
  *H01L 51/56* (2006.01)
  *H01L 51/42* (2006.01)

(52) U.S. Cl.
  CPC ...... *H01L 51/5072* (2013.01); *H01L 51/5092* (2013.01); *H01L 51/5234* (2013.01); *H01L 51/56* (2013.01); *H01L 51/426* (2013.01); *H01L 51/502* (2013.01); *H01L 2251/305* (2013.01)

(56) References Cited

U.S. PATENT DOCUMENTS

| | | |
|---|---|---|
| 2015/0093583 A1 | 4/2015 | Hosono et al. |
| 2015/0137103 A1 | 5/2015 | Hosono et al. |
| 2016/0285027 A1 | 9/2016 | Hosono et al. |
| 2017/0084761 A1 | 3/2017 | Cho et al. |
| 2017/0186990 A1 | 6/2017 | Nakamura et al. |
| 2019/0081262 A1 | 3/2019 | Kim et al. |

FOREIGN PATENT DOCUMENTS

| | | |
|---|---|---|
| KR | 10-2018-0054329 | 5/2018 |
| KR | 10-2018-0057198 | 5/2018 |
| KR | 10-2018-0060440 | 6/2018 |
| KR | 10-2018-0069687 | 6/2018 |
| WO | WO2013/191212 | 12/2013 |
| WO | WO2015/098458 | 7/2015 |
| WO | WO2017/094547 | 6/2017 |

OTHER PUBLICATIONS

Liuqi Zhang et al., "Ultra-bright and highly efficient inorganic based perovskite light-emitting diodes", Nature Communications 8, Article No. 15640 (2017), Published: Jun. 7, 2017.
International Search Report dated Aug. 13, 2019 with respect to PCT/JP2019/023604.

FIG.13C

| | Material | Wavelength (nm) | Voltage (V) at $10^2$, $10^3$, and $10^4$ cd/m² | $L_{max}$ (cd/m²) | Current Efficiency (cd/A) |
|---|---|---|---|---|---|
| Embodiment | 3D CsPbBrCl₂ | 452 | 4.5, —, — | 150 | 0.025 |
| Comparative example | 2D BA₂MA$_{n-1}$Pb$_n$Br$_{3n+1}$ | 444 | —, —, — | 1.5 | 0.006 |
| | 2D POEA₂MA$_{n-1}$Pb$_n$Br$_{3n}$ | 462 | —, —, — | 1.26 | 0.07 |
| | 2D MAPbBr₃ | 456 | —, —, — | 1.3 | 0.049 |
| | 0D CsPb(Br,Cl)₃ | 469 | 7.8, —, — | 111 | 0.33 |

PHOTOELECTRONIC DEVICE, FLAT PANEL DISPLAY USING THE SAME, AND FABRICATION METHOD OF PHOTOELECTRONIC DEVICE

CROSS-REFERENCE TO RELATED APPLICATIONS

This application is a continuation application filed under 35 U.S.C. 111(a) claiming benefit under 35 U.S.C. 120 and 365(c) of PCT International Application No. PCT/JP2019/023604 filed on Jun. 14, 2019, which further claims the benefit of the priority to earlier Japanese patent Application No. 2018-126332 filed Jul. 2, 2018, the contents of which are incorporated herein by reference in its entirety.

FIELD

The present disclosure relates to a photoelectronic device, a flat panel display using the same, and a fabrication method of a photoelectronic device.

BACKGROUND

In a flat panel display, an organic electroluminescent (EL) device using an organic light emitting material of a low molecular weight or high molecular weight (polymer), is adopted as a display device. An organic light emitting material is advantageous because of the high quantum efficiency and ease of film formation over a large area substrate; however, there are also disadvantages such as deterioration of optical or electrical property due to oxygen or moisture, or a greater full width at half maximum (FWHM) of the emission spectrum. In addition, due to high resistivity of such an organic material, an EL device requires a higher operating voltage, which increases power consumption. In order to improve the chemical stability and reduce the operating voltage of the organic EL device, a configuration of using amorphous C12A7 as the electron injection layer, while using amorphous ZnO—SiO$_2$ as the electron transport layer, is proposed. (See, for example, Patent Document 1 presented below.)

In recent years, research on using an inorganic material, such as a halide perovskite compound or a quantum dot, for the active layer has been actively made. Inorganic EL materials are advantageous, compared with organic materials, in the chemical stability and the feasibility of low-cost synthesis, while still being able to achieve quantum efficiencies as high as organic materials.

Zinc oxide (ZnO) nanoparticles are typically used in an electron transport layer for efficiently supplying electrons to a halide perovskite layer. However, ZnO nanoparticles require a complicated synthetic process such as surface ligand treatment, and the production cost is high. Moreover, leakage current or short circuit is likely to occur because pinholes are likely to be produced between adjacent particles during deposition of a thin film, and because surface roughness exists.

To reduce pinholes and improve surface flatness, a technique of inserting a thin film of insulating polymer such as polyvinylpyrrolidone (PVP) between the perovskite layer and the ZnO layer is known. (See. for example, Non-Patent Document 1 presented below.)

RELATED ART DOCUMENTS patent Document 1: Japan Patent No. 6284157
Non-patent Document 1: Zhang et al., Nature communications 8(2017): 15640

FIG. 1A and FIG. 1B show a conventional device configuration and the current density/luminance characteristics, respectively. A perovskite layer is provided between the ZnO layer, which serves as an electron transport layer, and the CBP (4,4'-N, N' dicarbazole biphenyl) layer, which serves as a hole transport layer. A PVP thin film is inserted between the perovskite layer and the ZnO layer. By inserting the PVP film as illustrated in FIG. 1A, carriers are confined, and pinholes are suppressed.

In FIG. 1B, the top three characteristic curves indicate voltage-dependent changes in current density (referring to the left vertical axis), and the bottom three characteristic curves indicate voltage-dependent luminance (referring to the right vertical axis). Without insertion of the PVP film (plotted by square marks), application of voltage breaks the device and the light emission is impaired. By inserting the PVP film, light emission of the device is maintained up to a high luminance level.

The conventional configuration illustrated in FIG. 1A and FIG. 1B has a complicated structure in which an insulating polymer film is inserted between the perovskite layer and the ZnO layer. In spite of the insertion of the insulating polymer, a considerable amount of dark current flows in the voltage range up to 2 V, and it is understood that the leakage current is not sufficiently suppressed. In addition, a driving voltage of 6 V is required to achieve the luminance level of $10^4$ cd/m$^2$, which level is generally required for light emitting devices. It could be considered that these drawbacks are due to an increase in the series resistance resulting from the insertion of the insulating PVP.

A photoelectronic device in which the leakage current is reduced and that exhibits a high-luminance electroluminescence characteristic at a low voltage is desired.

SUMMARY OF INVENTION

In one aspect of the disclosure, a photoelectronic device includes an active layer containing inorganic particles, and an oxide semiconductor layer containing zinc (Zn), silicon (Si) and oxygen (O), where the oxide semiconductor layer and the active layer are stacked layers. The photoelectronic device may further include a multilayer transparent electrode provided over or under the active layer, wherein the oxide semiconductor layer serves as a part of the multiplayer transparent electrode.

In another aspect of the disclosure, a photoelectronic device includes an active layer containing inorganic particles, and an oxide semiconductor layer containing at least zinc (Zn), silicon (Si), and oxygen (O), where the oxide semiconductor layer and the active layer are stacked layers, wherein electrical contact between the active layer and the oxide semiconductor layer is ohmic, and wherein a layer-averaged composition ratio Zn/(Si+Zn) of the oxide semiconductor layer is 0.7<Zn/(Si+Zn)<0.85.

The object and advantages of the invention will be realized and attained by means of the elements and combinations particularly pointed out in the claims. It is to be understood that both the foregoing general description and the following detailed description are exemplary and explanatory and are not restrictive to the invention as claimed.

BRIEF DESCRIPTION OF DRAWINGS

FIG. 13C is a diagram showing properties of the blue perovskite material used in the first embodiment, compared with other blue perovskite materials;

BEST MODE TO IMPLEMENT THE INVENTION

In the present disclosure, a high-mobility oxide semiconductor having a shallow conduction band level is used as a layer for supplying electrons to an inorganic active layer, thereby suppressing leakage current and achieving a high-luminance electroluminescence characteristic at low voltages.

Figure 2:
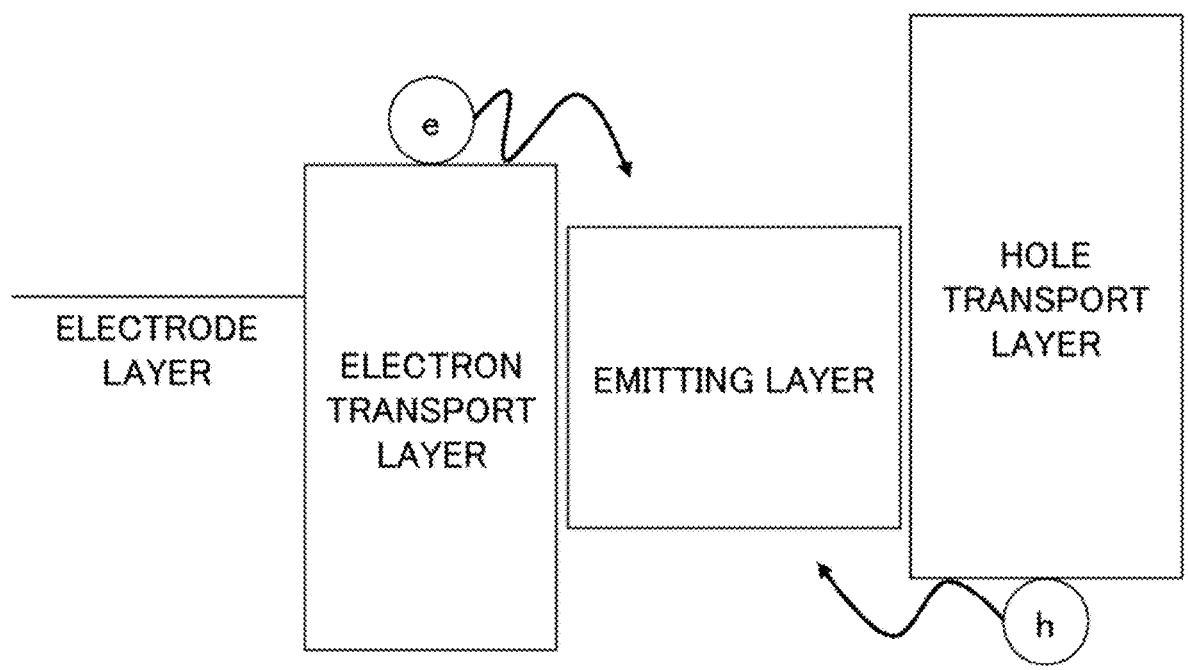
FIG. 2 is a diagram for explaining the properties required for a photoelectronic device.

FIG. 2 is a diagram for explaining the properties desired for a photoelectronic device. Assuming that the active layer is, for example, a light emitting layer, a configuration capable of confining electrons and holes in the active layer is desired for the efficient recombination of electron-hole pairs. Assuming that the active layer is a light absorbing layer or a light receiving layer, a configuration that efficiently extracts carriers produced by light absorption is desired.

In FIG. 2, the vertical direction represents the energy level. An ideal electron transport layer has a shallow conduction band level (with a low barrier) and a deep valence band level with respect to the emitting layer. Electrons easily overcome the barrier from the electrode layer and move to the light emitting layer, exhibiting high mobility. In the valence band, holes injected into the light emitting layer are blocked by the barrier, and the carriers are confined.

An ideal hole transport layer has a valence band position lower than the emitting layer and a high conduction band level with respect to the emitting layer, whereby the barrier for the holes is low and the hole mobility is high. In the conduction band, electrons injected into the emitting layer are blocked and the carriers are confined. For a light emitting device, in addition to the above-described conditions, both the electron transport layer and the hole transport layer are transparent, and a transparent electrode is used at the light emitting side. For a photodetector, layer(s) provided at the light incident side are transparent layer(s).

In the embodiments described below, an inorganic luminescent material with a satisfactory photoluminescence property is used for an active layer, and a layered structure that meets with the above-described conditions of electron injection and/or electron transport is adopted.

First Embodiment

Figure 3:
FIG. 3 is a schematic diagram of a photoelectronic device of the first embodiment.

FIG. 3 is a schematic diagram of the photoelectronic device 10 of the first embodiment. In the first embodiment, at least injection or transport of electrons into the active layer is implemented using an oxide semiconductor layer having a specific composition range. This oxide semiconductor layer is called an "electron conducting layer" in the embodiment. In the photoelectronic device 10, a transparent electrode 12, an electron conducting layer 13, an active layer 14, a hole transport layer 15, a hole injection layer 16, and a counterpart electrode 17 are stacked in this order on a substrate 11. This configuration employs an "inverted structure" in which the transparent electrode 12 is the cathode and the counterpart electrode 17 is the anode. The transparent electrode 12 is on the light emitting or incident side.

The substrate 11 has high transparency with respect to a target wavelength, and supports the layered structure of the photoelectronic device 10. The substrate 11 may be a glass substrate, or alternatively, a transparent plastic substrate may be used. When using a plastic substrate, a material superior in heat resistance, durability, and scientific stability is desirable. Suitable materials may include polyethylene terephthalate (PET), polyethylene naphthalate (PEN), transparent polyimide, or the like.

The transparent electrode 12 is a conductive layer transparent with respect to the target wavelength, and it may be formed of a metal oxide or a carbon material such as graphene. Examples of the metal oxide include tin oxide ($SnO_2$), zinc oxide (ZnO), zirconium oxide ($ZrO_2$), antimony oxide ($Sb_2O_3$), indium tin oxide (ITO), fluorine-doped tin oxide (FTO), indium zinc oxide (IZO), aluminum-doped zinc oxide ($ZnO—Al_2O_3$ abbreviated as "AZO"), GZO gallium-doped zinc oxide ($ZnO—Ga_2O_3$ abbreviated as "GZO"), Nb-doped $TiO_2$, Ta-doped $TiO_2$, indium oxide doped with tungsten trioxide and zinc oxide ($In_2O_3—WO_3—ZnO$ abbreviated as "IWZO"), and so on.

The electron conducting layer 13 contains at least zinc (Zn), silicon (Si) and oxygen (O), and has high electron mobility with a low potential barrier with respect to the active layer 14. As will be described later, in the electron conducting layer of the embodiment, the ratio of Zn to the total of Zn and Si (Zn/(Zn+Si)) is in an optimum range such that good current characteristic and electroluminescence characteristic can be acquired. As long as satisfactory electrical characteristics of the electron conducting layer 13 are maintained, metal impurities other than Zn and Si may be included. The electron conducting layer 13 is preferably in ohmic contact with the active layer 14. When the active layer 14 is used as a light emitting layer, the electron conducting layer 13 serves as both an electron injection layer and an electron transport layer. When the active layer 14 is used as a light absorption layer, the electron conducting layer 13 serves as both an electron extraction layer and an electron transport layer.

The electron conducting layer 13 may be an amorphous Zn—Si—O layer, or a mixed phase layer containing ZnO crystal grains scattered in the Zn—Si—O base.

The active layer 14 contains inorganic particles such as polycrystals of halogen compounds, or alternatively, it may contain quantum dots with the quantum confinement effect dispersed in the layer. The halogen compound may have a perovskite crystal structure. When the photoelectronic device 10 is applied to an arrayed device fabricated on a large-area substrate, it is preferable for the active layer 14 to be formed as a coating layer. In general, organic EL coatings are adopted in large-sized organic EL applications. However, the photoluminescence properties of organic EL materials are inadequate, compared with inorganic materials. In the embodiments, the active layer 14 is formed as a coating film, using an organic-inorganic hybrid material in which inorganic EL particles are dispersed almost uniformly in an organic solvent.

When the halogen compound is a halide perovskite, the crystal particle is a compound represented by the general formula $ABX_3$, and for example, $CsMX_3$ may be used, where X is selected from F, I, Br, Cl, or a compound thereof, and M is selected from a divalent metal such as Pb, Sn, Ni, Mn, Fe, Co, Ge, or a compound thereof. As a crystal structure other than perovskite, $Cs_3Cu_2I_5$ or the like with a crystal structure similar to perovskite and usable to form a solution-coated film may also be used.

Quantum dot can be made of the above-described halide perovskite. Alternatively, the quantum dot may be a cadmium-based, lead-based or Indium-based quantum dot such as CdSe, CdTe, PbS, or InP. The active layer of a halide perovskite is capable of continuously changing the emission wavelength by varying the composition of the halogen element. For example, the emission wavelength can be controlled by configuring $X_3$ of $CsPbX_3$ with $Br_yI_{3-y}$ and changing the composition ratio y from 0 to 3. When using quantum dots, continuous control on the emission wavelength can be achieved by adjusting the dot size. In addition, as will be described later, by changing the composition of the inorganic perovskite particles (such as $CsPbX_3$), while maintaining the same composition of the electron conducting layer 13, light emission in different wavelength ranges can be achieved.

The hole transport layer 15 can be any layer with a hole transport function. From the viewpoint of the fabrication process, it is preferable for the hole transport layer to be of a coating type and suitable for stacking layers. From the viewpoint of carrier mobility and electron confinement, it is desirable that the maximum level of the valence band with respect to that of the active layer 14 is shallow and that the minimum level of the conduction band with respect to that of the active layer is high.

The hole transport layer 15 may be formed of, for example, an arylamine-based compound, an amine compound containing a carbazole group, an amine compound containing a fluorene derivative, or the like. To be more specific, the hole transport layer 15 contains 4,4'-bis [N-(naphthyl)-N-phenyl-amino] biphenyl (α-NPD), N, N'-bis (3-methylphenyl)-(1,1'-biphenyl)-4,4'-diamine (TPD), 2-TNATA, 4,4', 4"-tris (N-(3-methylphenyl) N-phenylamino) triphenylamine (MTDATA), 4,4'-N, N'-dicarbazolebiphenyl (CBP), Spiro-NPD, Spiro-TPD, Spiro-TAD, TNB or the like.

The hole injection layer 16 can be any layer with a hole injecting function. As an example, an organic film such as copper phthalocyanine (CuPc) or starburst amine may be used. Alternatively, a metal oxide thin film may be used. Examples of such metal oxide include, but not limited to, an oxide material containing one or more metals selected from molybdenum, tungsten, rhenium, vanadium, indium, tin, zinc, gallium, titanium or aluminum.

The hole injection layer 16 may be formed by a dry process such as a vapor deposition method or a transfer method, or by a wet process such as spin coating or spray coating.

The hole injection layer 16 and the hole transport layer 15 are not essential for the photoelectronic device 10, and one or both of them may be omitted.

The counterpart electrode 17 is a film of any conductive material including metal, carbon material, metal oxide, polymer, etc. As a metal electrode, aluminum, silver, tin, gold, carbon, iron, cobalt, nickel, copper, zinc, tungsten, vanadium, or an alloy thereof may be used.

Although the inverted structure is adopted in the example of FIG. 3, the transparent electrode 12 on the substrate 11 may be used as an anode and the counterpart electrode 17 may be used as a cathode. In this case, the electron conducting layer 13 of the embodiment is provided between the counterpart electrode 17 and the active layer 14. At least one of the hole transport layer 15 and the hole injection layer 16 may be inserted between the transparent electrode 12 and the active layer 14.

A fabrication method of the photoelectronic device 10 of the first embodiment includes, at least, (a) a step of forming an active layer 14 by applying a solvent in which inorganic particles of a halogen compound having a perovskite structure or a quantum dot having a quantum confinement effect are dispersed onto a substrate, and (b) a step of forming a stack of the active layer 13 and an electron conducting layer 13 containing at least zinc (Zn), silicon (Si) and oxygen (O).

As long as the active layer 14 and the electron conductive layer 13 are stacked between the pair of electrodes, the stacking order or the sequence of forming the active layer 14 and the electron conducting layer 13 does not matter. The electron conducting layer 13 may be formed by sputtering, pulsed laser deposition (PLD), physical vapor deposition (PVD), vacuum deposition, or any other suitable method.

The thickness of the electron conducting layer 13 is preferably 20 nm to 300 nm. Since the electron conducting layer 13 of the embodiment has an electron mobility several orders of magnitude greater than that of an organic electron conducting film, the film thickness can be further increased. However, the above-described range is desirable from the viewpoint of downsizing of the device. The film thickness of the electron conducting layer 13 can be further reduced by using the film forming method described above; however, the above-described range is desirable from the viewpoint of suppressing leakage current and preventing short circuit.

The thickness of the active layer 14 may be appropriately selected from the range of, for example, 10 nm to 200 nm, as long as it is suitable for recombination of electron-hole pairs or generation of carriers by light absorption. The active layer 14 can be formed by spin coating, spray coating, nozzle coating or the like.

Next, the optimum composition range of the electron conducting layer 13 is discussed. A plurality of samples with different composition ratios of Zn to (Zn+Si) of the electron conducting layer 13 are fabricated.

<Fabrication of Samples>

A glass substrate with an ITO film of 30 mm×30 mm is prepared to provide the substrate 11 and the transparent electrode 12 of the photoelectronic device 10. The thickness of the ITO film is 150 nm. A ZSO film of 120 nm thickness is formed on the ITO film (that is, on the transparent electrode 12) by DC magnetron sputtering to provide the electron conducting layer 13.

When the ZSO film is formed, the ratio between the ZnO target and the SiO2 target is adjusted so as to change the composition ratio of Zn with respect to the total of Zn and Si (Zn/(Zn+Si)) to fabricate different kinds of samples. For a comparative structure, a sample with a ZnO electron conducting film without using $SiO_2$ is also fabricated.

An active layer 14 of 80 nm thickness is formed on the ZSO electron conducting layer 13 by dissolving a mixture of $CsPbBr_3$ and polyethylene oxide (PEO) in Dimethyl sulfoxide (DMSO) which is an organic solvent, and by spin-coating the prepared solution. Because the ZSO film deposited by sputtering is chemically stable in the atmosphere and in organic solvents, the active layer 14 can be formed as a coating film applied onto the ZSO film.

An NPD film having a thickness of 40 nm and a molybdenum oxide ($MoO_x$) film having a thickness of 7 nm are formed on the active layer 14 by resistance heating vapor deposition. The NPD film is used as the hole transport layer 15, and the $MoO_x$ film is used as the hole injection layer 16.

Finally, a silver (Ag) film with a thickness of 100 nm is formed by resistance heating vapor deposition to provide a counterpart electrode 17. Using the plurality of samples thus formed, the composition dependence of the optical characteristics and the electrical characteristics is measured.

<Measurement Result>

Figure 4A:
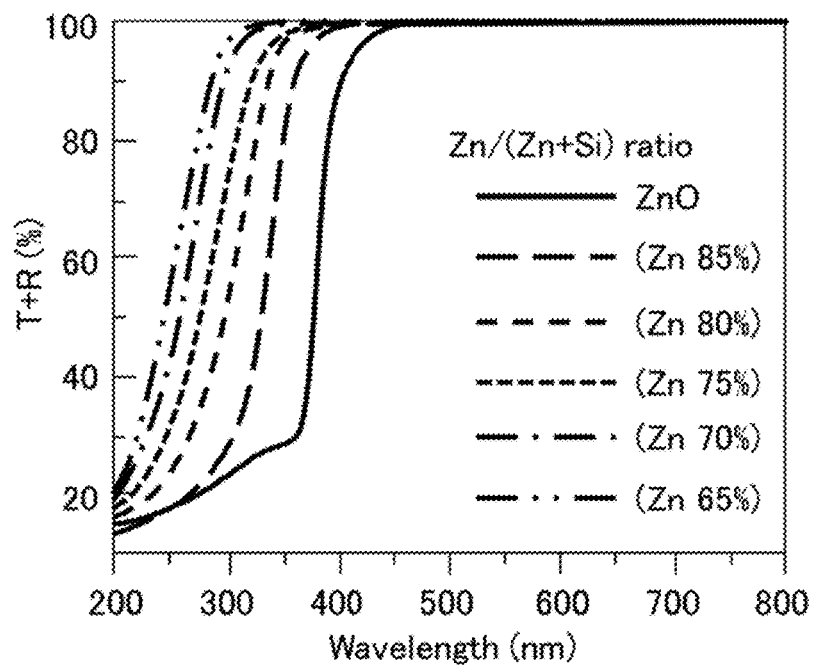
FIG. 4A is a diagram showing the composition dependence of the optical characteristics of a ZnO—SiO$_2$ (which is referred to as "ZSO" in the following description) film used in the photoelectron device of the first embodiment.
Figure 4B:
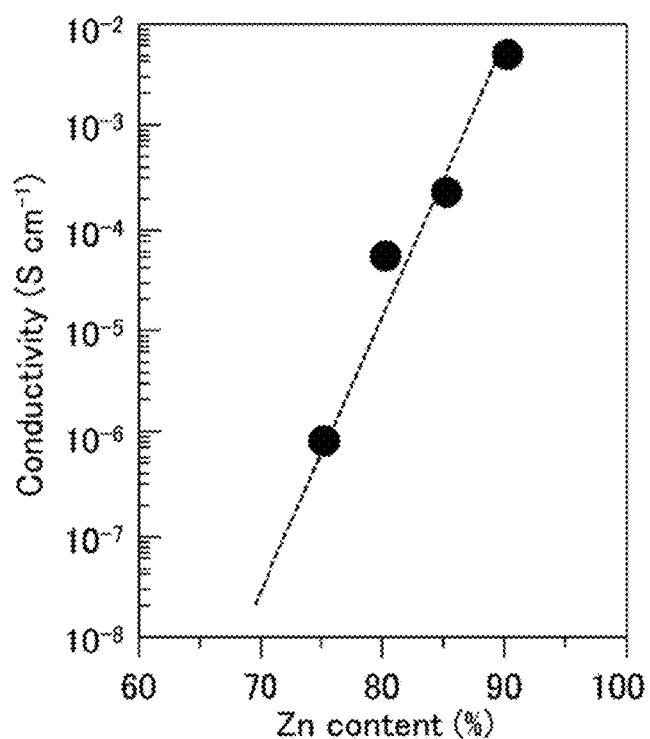
FIG. 4B is a diagram showing the composition dependence of the electrical characteristics of the ZSO film used in the photoelectron device of the first embodiment.

FIG. 4A and FIG. 4B show the characteristics measurement results of the ZSO film used as the electron conducting layer 13 of the photoelectronic device 10. FIG. 4A shows the composition dependence of the optical characteristics of the ZSO film, and FIG. 4B shows the composition dependence of the electrical characteristics of the ZSO film.

In FIG. 4A, the horizontal axis represents wavelength, and the vertical axis represents the total of transmittance T and reflectance R. The measurement was carried out using samples with the layer-averaged ZSO composition ratio Zn/(Si+Zn) of 65%, 70%, 75%, 80%, and 85%. For comparison, a sample with the layer-averaged ZSO composition ratio Z/(Si+Zn) of 100%, that is, a sample with a ZnO electron conducting film is also measured.

By changing the layer-averaged composition ratio Zn/(Si+Zn) from 65% to 85%, the wavelength at the absorption edge is shifted to the longer wavelength side. In the ZnO film of the comparative example, absorption occurs in a specific wavelength range, and a loss occurs in the light generated by recombination in the active layer or the light incident on the active layer.

In FIG. 4B, the horizontal axis represents Zn content (%) in (Zn+Si), and the vertical axis represents conductivity. The higher the Zn content, the higher the conductivity. At the Zn content of 65% and 70%, the specific resistance cannot be measured, and the conductivity of the ZSO film is smaller than $10^{-8}$ $Scm^{-1}$.

In the samples with a layer-averaged composition ratio of Zn/(Si+Zn) up to about 80%, the ZSO film is formed as an amorphous film containing zinc (Zn), silicon (Si) and oxygen (O). When the ratio of Zn to (Zn+Si) exceeds 80%, a mixed phase film in which ZnO crystals are mixed in the Zn—Si—O matrix is acquired.

Figure 5:
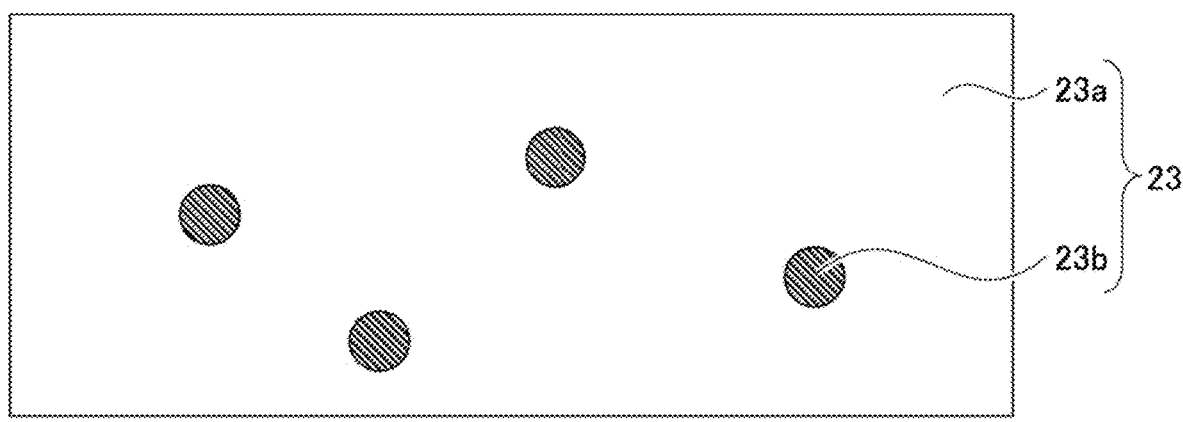
FIG. 5 is a schematic diagram of a ZSO film.

FIG. 5 is a schematic diagram of the mixed-phase ZSO film 23. The ZSO film 23 contains ZnO crystals 23b mixed in the Zn—Si—O matrix 23a. It is inferred that the ZnO crystals contribute to the conductivity.

Figure 6A:
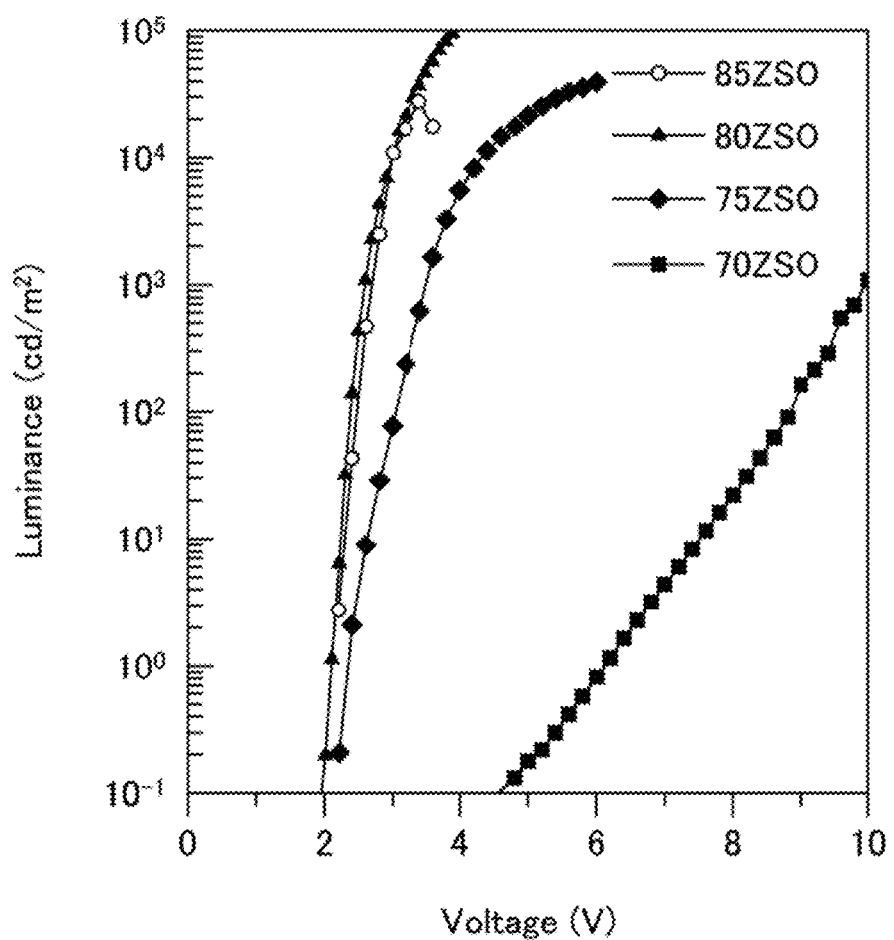
FIG. 6A is a diagram showing a characteristic measurement result of a ZSO film used in the photoelectronic device of the first embodiment.
Figure 6B:
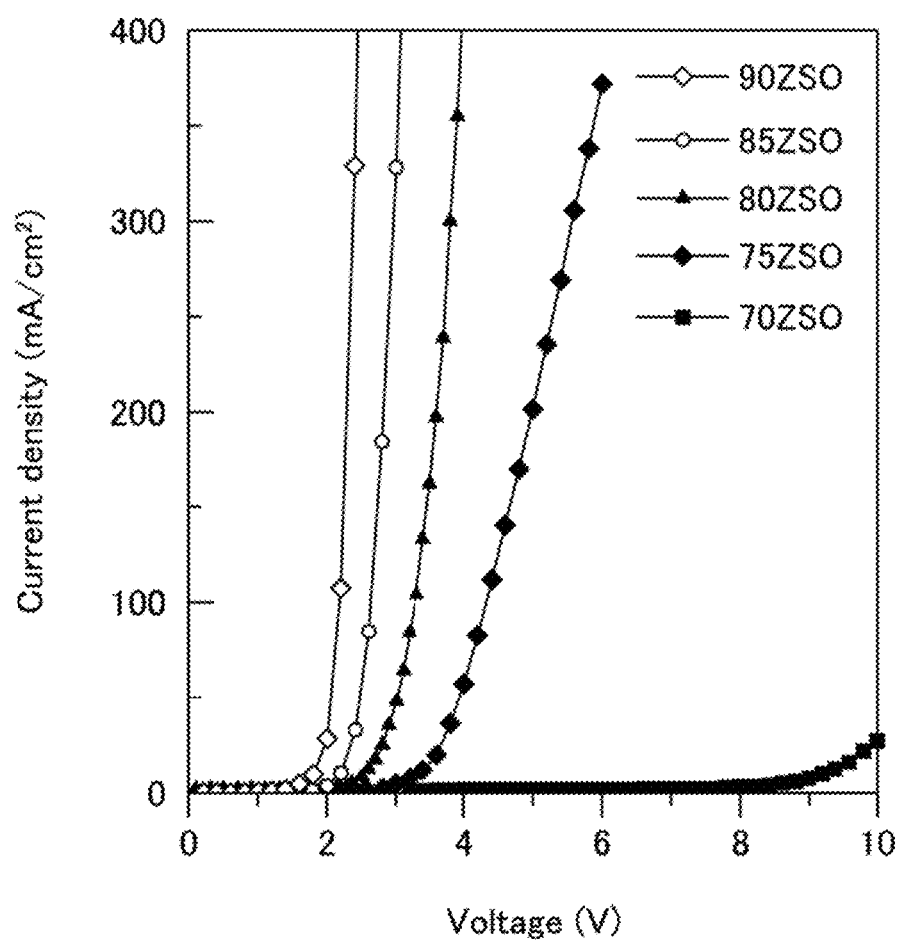
FIG. 6B is a diagram showing a characteristic measurement result of a ZSO film used in the photoelectron device of the first embodiment.

FIG. 6A and FIG. 6B illustrate other measurement results showing the ZSO composition dependence of the characteristics of the photoelectronic device 10. In the measurement, $CsPbBr_3$ (which may be referred to as "green perovskite" from its emission wavelength) is used as the active layer 14. FIG. 6A shows the change in luminance with respect to voltage, and FIG. 6B shows the change in current density with respect to voltage. In FIG. 6A, with a sample of 70% Zn ratio (labelled as "70ZSO" in the figure), the luminance level does not promptly increase, and even at a voltage of 10 V, the luminance cannot reach $10^4$ $cd/m^2$.

With a sample of 85% Zn ratio (labelled as "85ZSO" in the figure), the luminance decreases before the desired level is achieved, and the device breaks at a certain voltage. When the Zn ratio is 90%, light emission itself is not observed. From the viewpoint of luminance characteristic, it is desirable that the Zn/(Si+Zn) composition ratio is greater than 70% and smaller than 85%. For example, when the Zn ratio is 80% (labelled as "80ZSO" in the figure), a luminance of $10^5$ cm/m² is achieved at a voltage as low as 2.9 V.

In FIG. 6B, with the sample of 70% Zn ratio, the resistance is high, and a sufficient current density cannot be obtained even by applying a voltage. The samples with Zn ratios of 75%, 80%, 85%, and 90% exhibit satisfactory voltage-current characteristics. However, with the samples of 85% Zn ratio and 90% Zn ratio, the luminance characteristic required for the device is not obtained (see FIG. 6A). Therefore, the Zn/(Si+Zn) composition ratio greater than 70% and smaller than 85% is preferable.

The energy band structure changes by adjusting the Zn ratio of ZSO. By selecting the composition of ZSO within the range $$70\%<Zn/(Si+Zn)<85\%,$$

an appropriate bandgap structure is produced with respect to the active layer 14 containing inorganic particles, and thus, high electron mobility and hole blocking effect can be obtained.

Figure 6C:
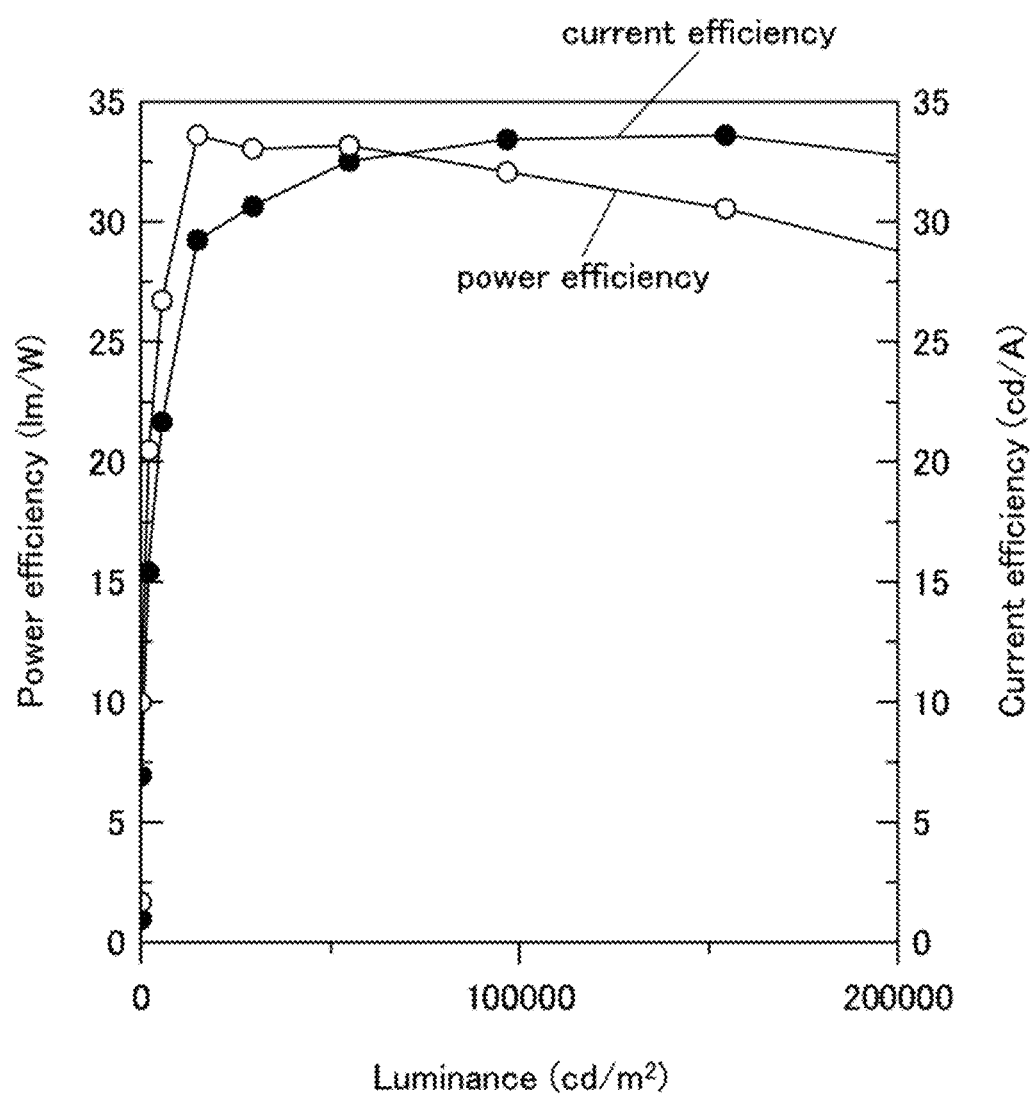
FIG. 6C is a diagram showing power efficiency and current efficiency of the photoelectronic device of the first embodiment.

FIG. 6C shows power efficiency and current efficiency of a sample with 80% Zn ratio of ZSO and using $CsPbBr_3$ for the active layer 14. The horizontal axis represents luminance, the left vertical axis represents power efficiency, and the right vertical axis represents current efficiency. A high power efficiency of 33 lm/W is achieved, and the current efficiency is also high.

Figure 7:
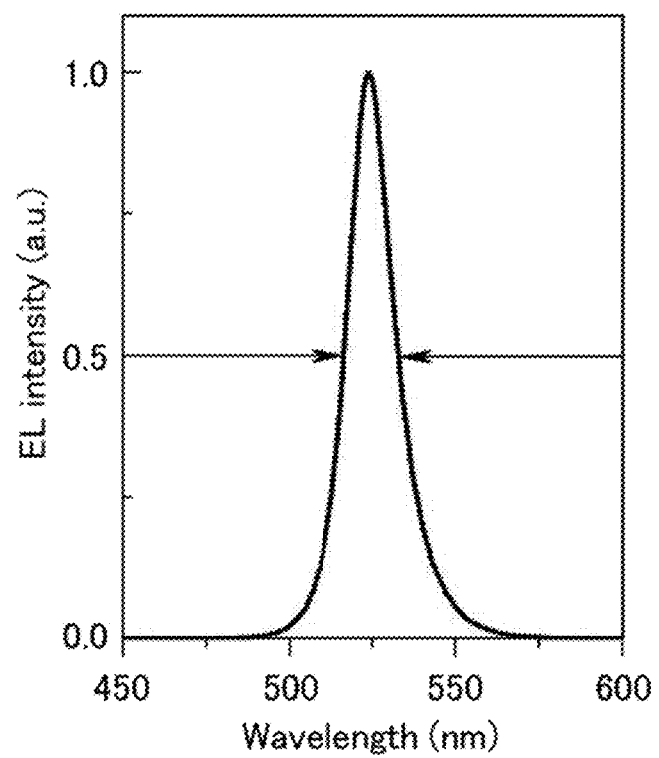
FIG. 7 shows the electroluminescence spectrum of the photoelectronic device of the first embodiment.

FIG. 7 shows the emission spectrum of a sample having a layer-averaged composition ratio Zn/(Si+Zn) of 80% in ZSO. The FWHM is about 16 nm, and satisfactory luminescence characteristic is observed. A similar emission spectrum is observed from a sample having a layer-averaged composition ratio Zn/(Si+Zn) of 70% in ZSO, with FWHM of 15 nm.

Figure 1A:
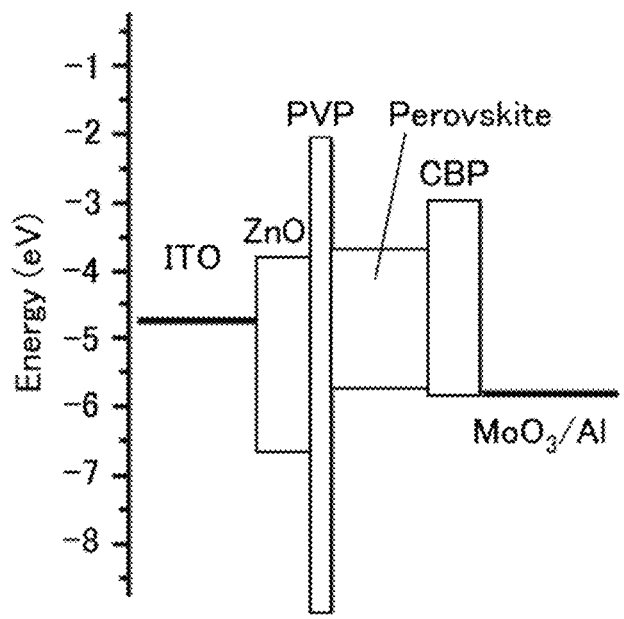
FIG. 1A is a diagram showing a configuration of a conventional EL device.
Figure 1B:
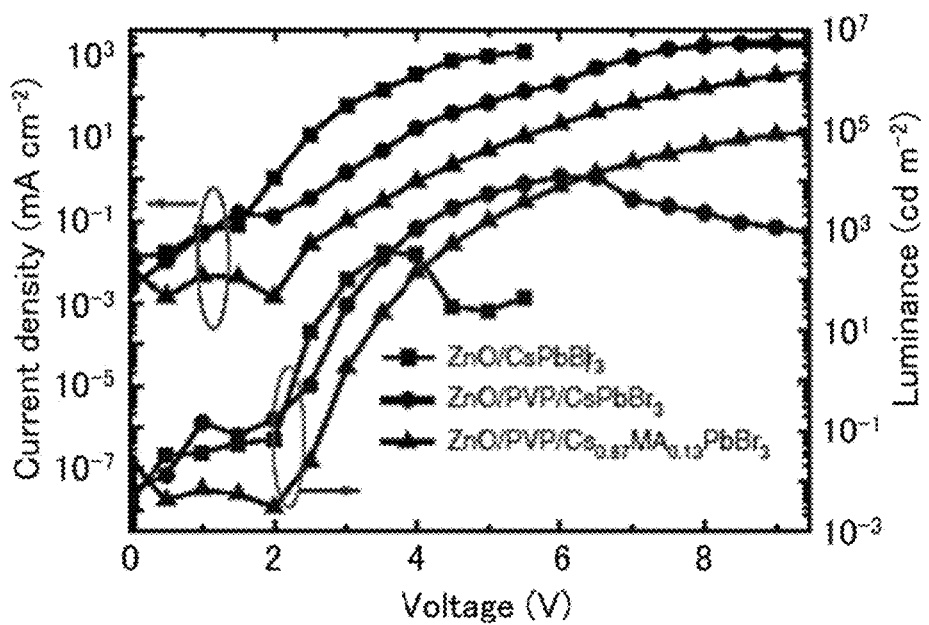
FIG. 1B is a diagram showing current and luminescence characteristics of the conventional EL device.
Figure 8:
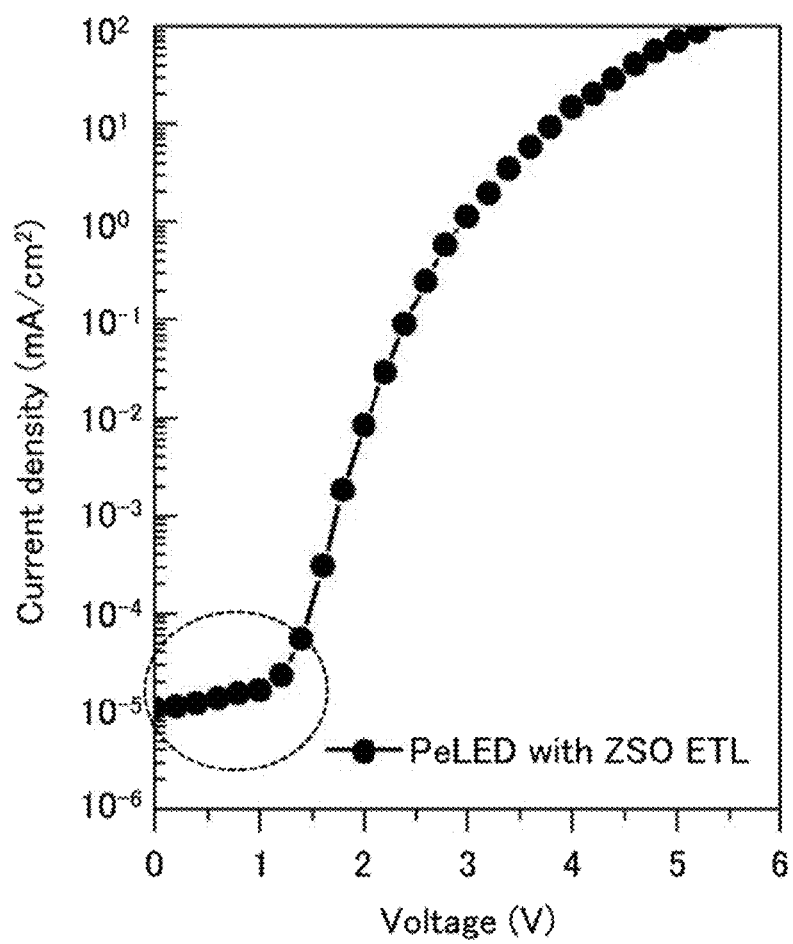
FIG. 8 shows voltage-current characteristics of the optoelectronic device of the first embodiment.

FIG. 8 shows the current-voltage characteristic of a sample with a 75% Zn ratio in ZSO. As indicated by the circle, the leakage current is as low as $10^{-5}$ mA/cm². The leakage current is reduced by two order of magnitude, compared with the conventional device characteristic illustrated in FIG. 1B where a leakage current of $10^{-3}$ mA/cm₂ or more is observed.

Figure 9:
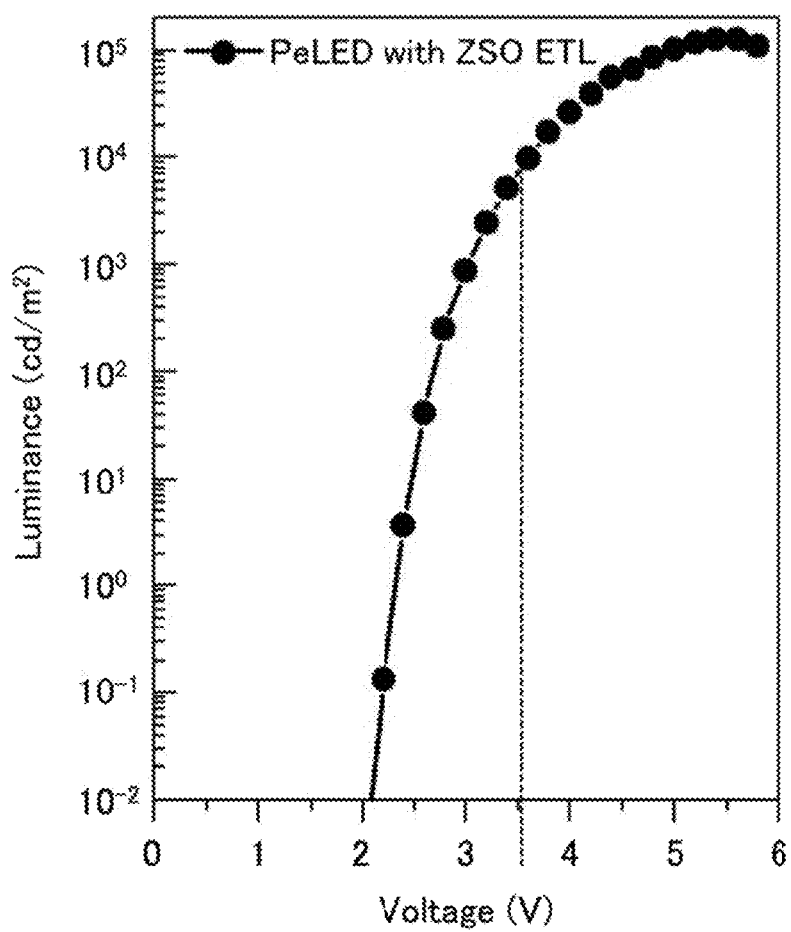
FIG. 9 shows the electroluminescence characteristic of the photoelectronic device of the first embodiment.

FIG. 9 shows the luminance characteristic of the same sample. This luminance characteristic corresponds to that of the "75ZSO" sample in FIG. 6A. By applying a voltage of 3.5 V, the luminance level of $10^4$ cd/m², which is typically required for a light emitting device, can be achieved. Compared with the characteristic of the conventional device illustrated in FIG. 1B, which needs a voltage application of 6 V or more to achieve the same luminance level, the drive voltage can be reduced by 40% or more.

From the above-described measurement results, it is understood that the barrier of ZSO with respect to the active layer 14 containing inorganic particles is low, and that these layers are electrically connected with a sufficiently small contact resistance. It can be said that the electrical connection between the ZSO electron conducting layer 13 and the active layer 14 is ohmic connection.

Modification

Figure 10:
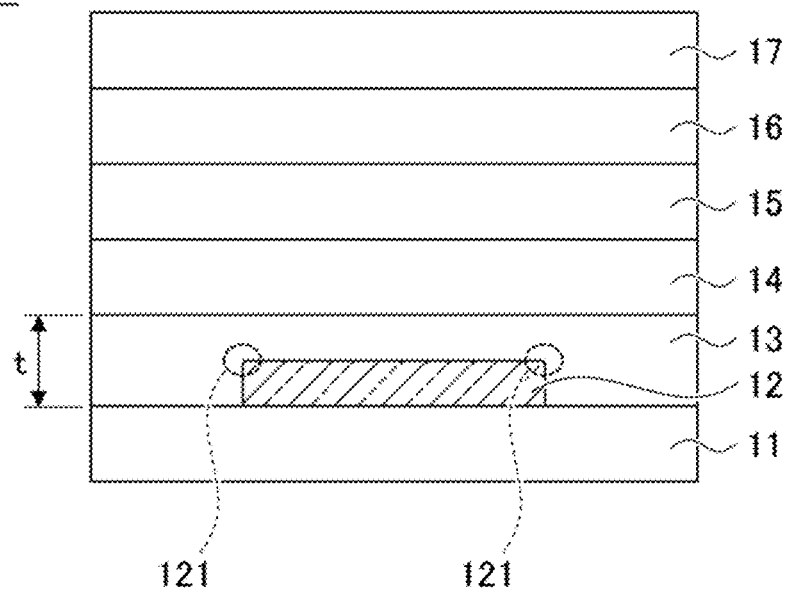
FIG. 10 is a schematic diagram of a modified example of the layered structure of the photoelectronic device of the first embodiment.

FIG. 10 is a schematic diagram of a photoelectronic device 10A which is a modification of the device of FIG. 3. In the photoelectronic device 10A, the top surface and the side walls of the transparent electrode 12 are completely covered with the electron conducting layer 13 of ZSO, and leakage current is suppressed at the corners 121 of the transparent electrode 12.

In a layout with a plurality of photoelectronic devices 10A arranged in an array on the substrate 11, the transparent electrodes 12 are patterned into a predetermined shape, and then the ZSO electron conducting layer 13 is formed over the entire surface of the substrate 11. Depending on the coverage of the electron conducting layer 13, leakage current may be generated at the corners 121 of the transparent electrode 12.

By forming the ZSO electron conducting layer 13 with a thickness equal to or greater than the thickness of the transparent electrode 12, leakage current can be prevented from flowing through the stepped sections or the corners 121 of the transparent electrode 12. For example, when the thickness of the transparent electrode 12 is 150 nm, the thickness "t" of the ZSO electron conducting layer 13 is set to 150 nm or more. In addition to the leakage prevention effect, the flatness of the electron conducting layer 13 is ensured. Coating of the active layer 14 and the subsequent process of forming the layered structure of the hole transport layer 15, the hole injection layer 16 and the counterpart electrode 17 become easier.

<Application of Photoelectronic Device>

The configuration of the photoelectronic device 10 (or the photoelectronic device 10A) described above is applicable to a light emitting device, a photodetector, a solar cell, a display device, and so on. When the photoelectronic device 10 is applied to a light emitting device, a voltage is applied between the transparent electrode 12 and the counterpart electrode 17 to cause current injection into the active layer 14, and the light produced by recombination is extracted. In this application, the electron conducting layer 13 serves as an electron transport/injection layer with high electron mobility. In the inverted structures of FIG. 1 and FIG. 10, the counterpart electrode 17 is used as an anode, the transparent electrode 12 is used as a cathode, and light is extracted from the transparent electrode 12.

In an application of the photoelectronic device 10 to a photodetector or a solar cell, upon incidence of light having an energy equal to or greater than the band gap of the active layer 14, electrons are excited from the valence band to the conduction band, and holes are created in the valence band. In this case, the electron conducting layer 13 serves as an electron extraction/transport layer.

Figure 11A:
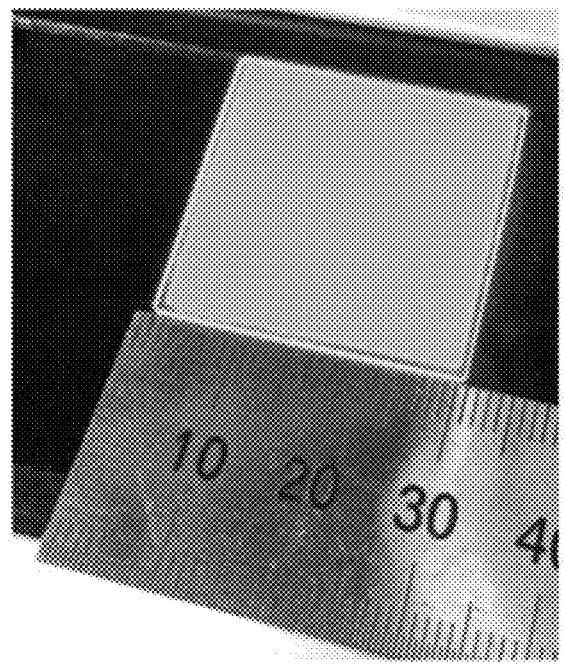
FIG. 11A is an image of a photoelectronic device fabricated by the method of the first embodiment.
Figure 11B:
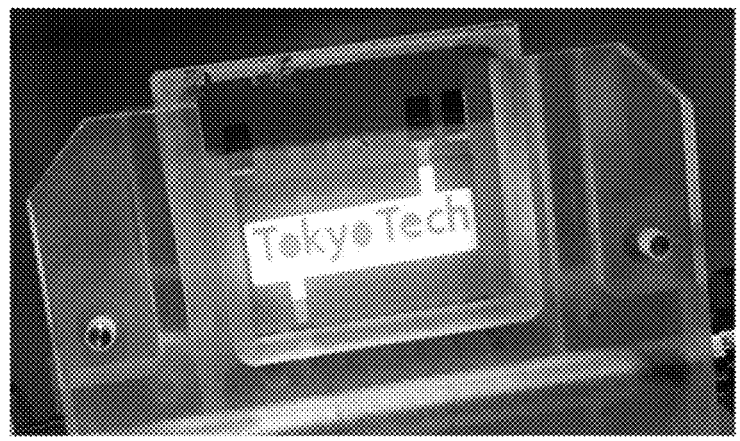
FIG. 11B is an image of another photoelectronic device fabricated by the method of the first embodiment.

FIG. 11A and FIG. 11B are images of photoelectronic devices 10 fabricated as light emitting devices. FIG. 11A shows the light emitting state of the device fabricated on a glass substrate with an ITO film of 30 mm×30 mm. An active layer 14 of $CsPbBr_3$ is formed by spin coating on the ZSO electron conducting layer 13 with a Zn ratio of 80%. The device is excited by UV light of 365 nm. As can be understood from the emission spectrum of FIG. 7, the central wavelength of the device using the active layer 14 containing halide perovskite particles of $CsPbBr_3$ is 525 nm, and green band emission is observed. In FIG. 11A, uniform emission is observed over the entire area of 30 mm×30 mm. Because the electron conducting layer 13 having high electron mobility is used as the electron transport/injection layer for supplying electrons into the active layer 14, high level photoemission can be obtained at a low drive voltage when employing a voltage driving scheme, instead of photoexcitation.

FIG. 11B shows emission from a 20 mm×5 mm light emitting device with some characters patterned in the emission area. A patterned ZnO layer with a thickness of 20 nm is provided at the interface between the active layer 14 of CsPbBr$_3$ and the electron conducting layer 13 of amorphous ZSO with a 80% Zn ratio. The ZnO film is patterned into characters "Tokyo Tech". The active layer 14 and the amorphous ZSO electron conducting layer 13 are in ohmic contact with each other in the area except for the pattern of characters.

Because the conductivity of ZnO is one order of magnitude greater than that of the ZSO layer, the series resistance is negligible. Photoemission acquired from the ohmic contact area between CsPbBr$_3$ and ZSO is brighter, compared with the character-patterned ZnO area.

Figure 12A:
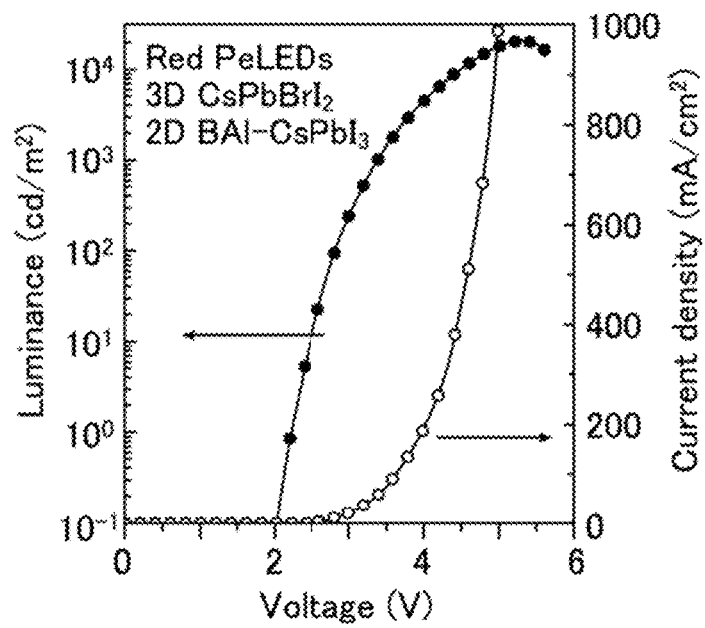
FIG. 12A shows the luminance characteristic of a photoelectronic device of the first embodiment that emits red light.
Figure 12B:
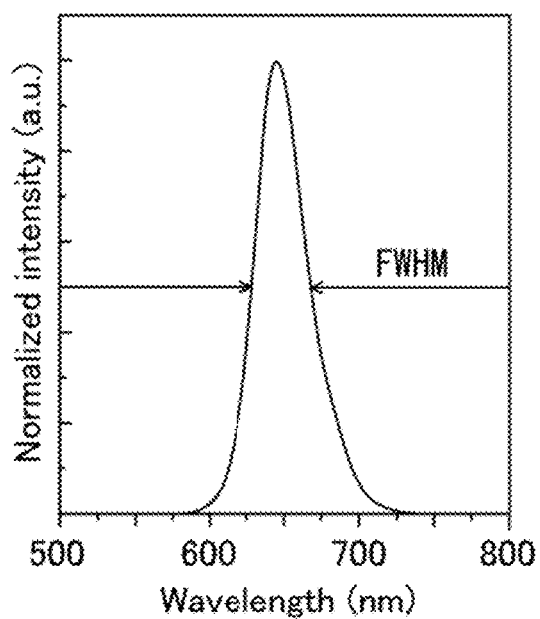
FIG. 12B shows the emission spectrum of the photoelectronic device of FIG. 12A.

FIG. 12A and FIG. 12B show emission characteristics of a red (R) perovskite. As described above, the emission wavelength can be controlled by changing the composition of the inorganic material contained in the active layer 14. A remarkable point in the first embodiment is that photoemission can be controlled so as to emit at different wavelengths efficiently simply by changing the composition of the inorganic material of the active layer 14, without changing the ZSO composition of the electron conducting layer 13.

FIG. 12A shows luminance and current characteristics of a photoelectronic device 10 using the active layer 14 formed as a coating layer containing inorganic particles of CsPbBrI$_2$. For the electron conducting layer 13, ZSO with a Zn ratio of 80% is used as in FIG. 7 and FIG. 11. Closed circles represent luminance with respect to voltage, and open circles represent current density with respect to voltage.

Luminance of $10^2$ cd/m$^2$ is obtained at 2.8 V, luminance of $10^3$ cd/m$^2$ is obtained at 3.4 V, luminance of $10^4$ cd/m$^2$ is obtained at 4.5 V, and the maximum luminance is 20000 cd/m$^2$. It is notable that such a high luminance can be achieved in the red wavelength band because a typical red perovskite LED does not reach 1000 cd/m$^2$ even at the maximum light-emission luminance.

FIG. 12B shows a photoluminescence spectrum of the device of FIG. 12A. The peak wavelength of the photoluminescence is around 650 nm, and the FWHM is 40 nm. From FIG. 12A and FIG. 12B, it is understood that by forming the electron conducting layer 13 of ZSO with a predetermined composition, high-luminance red light emission is obtained at a relatively low driving voltage.

Figure 13A:
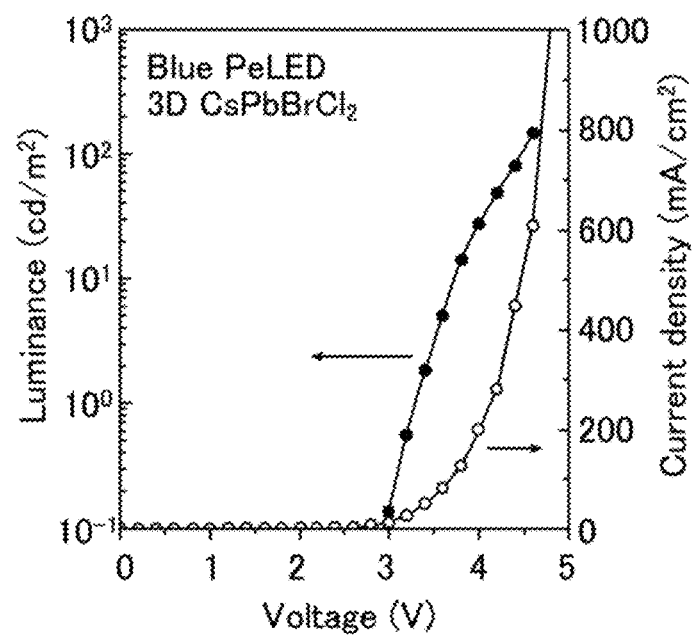
FIG. 13A shows the luminance characteristic of the photoelectronic device of the first embodiment that emits blue light.
Figure 13B:
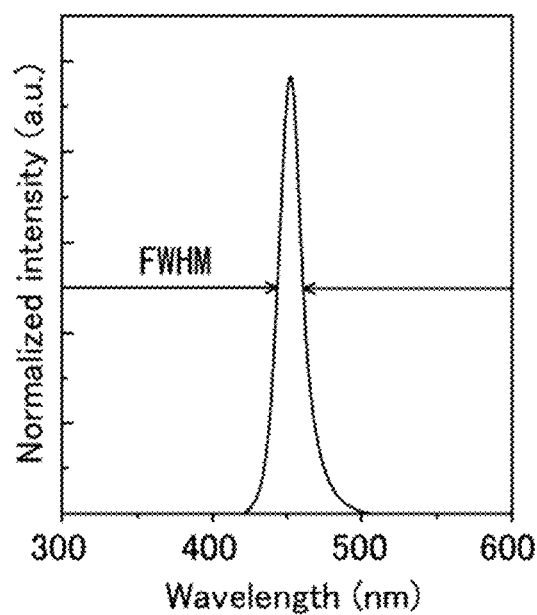
FIG. 13B shows the emission spectrum of the photoelectronic device of FIG. 13A.

FIG. 13A and FIG. 13B show emission characteristics of a blue (B) perovskite. FIG. 13A shows luminance and current characteristics of a photoelectronic device 10 using the active layer 14 formed as a coating layer containing inorganic particles of CsPbBrCl$_2$. As the electron conducting layer 13, ZSO having a Zn ratio of 80% is used as in FIG. 12A and FIG. 12B. Closed circles represent luminance with respect to voltage, and open circles represent current density with respect to voltage.

Although the operating voltage of the blue perovskite of the embodiment is higher than those of the green perovskite and the red perovskite, a luminance of $10^2$ cd/m$^2$ is achieved at 4.5 V, and the maximum luminance is 150 cd/m$^2$. As shown in FIG. 13B, the photoluminescence spectrum of this device shows a good spectral profile with a peak wavelength of about 452 nm and a FWHM of 16 nm.

FIG. 13C shows properties of the blue perovskite of the embodiment formed on the ZSO, in comparison with the properties of other blue perovskite materials. Unlike the configuration of the embodiment, in the blue perovskite quantum wells (2D-structures) lacking ZSO underlayers, the maximum luminance is only about 1 to 2 cd/m$^2$, which means that almost no light is emitted. With the blue perovskite quantum dot (0D structure) itself, a voltage near 8 V has to be applied in order to achieve a luminance of 100 cd/m$^2$. It is notable that the configuration of the embodiment achieves the luminance of 150 cd/m$^2$ with the blue perovskite.

By using ZSO with a controlled Zn ratio as the electron conducting layer 13, good charge transport characteristics and the quantum confinement effect are obtained in the active layer 14 for each of the wavelengths of R, G, and B. It is considered that this is because the desirable energy band structure, as illustrated in FIG. 2, is realized between the composition-controlled ZSO and the inorganic perovskite.

Since active layers 14 containing inorganic materials having different compositions (for different wavelength bands) can be formed on the same ZSO with the same composition, patterns of active layers 14 corresponding to the respective wavelengths of R, G and B can be formed, for example, on a large-area ZSO layer by an inkjet technique or the like. This is a great advantage over the conventional organic EL material. In using an organic EL material, it needs to individually select the optimum electron transport layer and the optimum electron injection layer depending on which organic material is used, and it is difficult to form multicolor organic cells using the same underlayer.

Figure 14A:
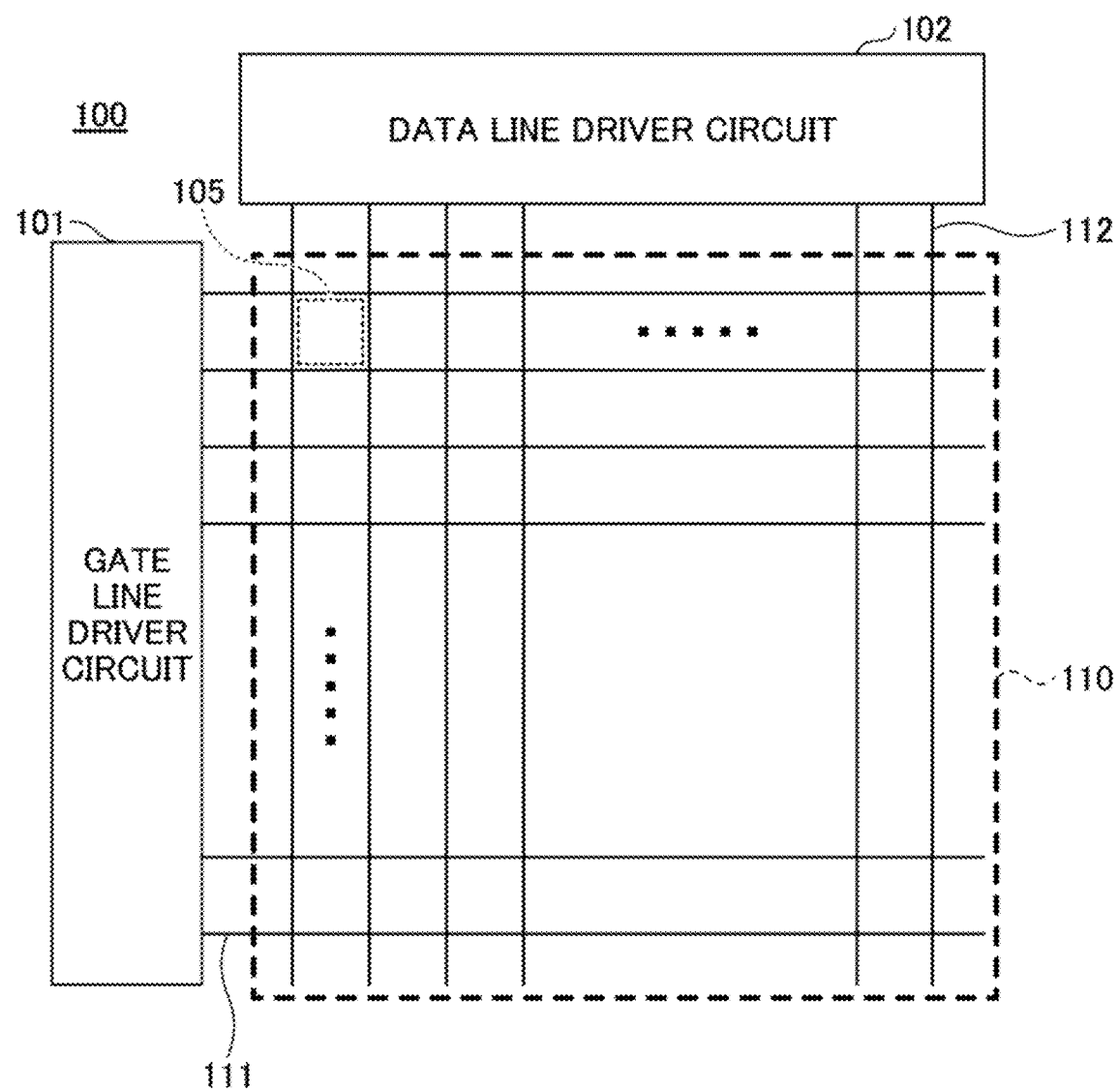
FIG. 14A is a schematic diagram of a flat panel display using the photoelectronic device of the first embodiment.
Figure 14B:
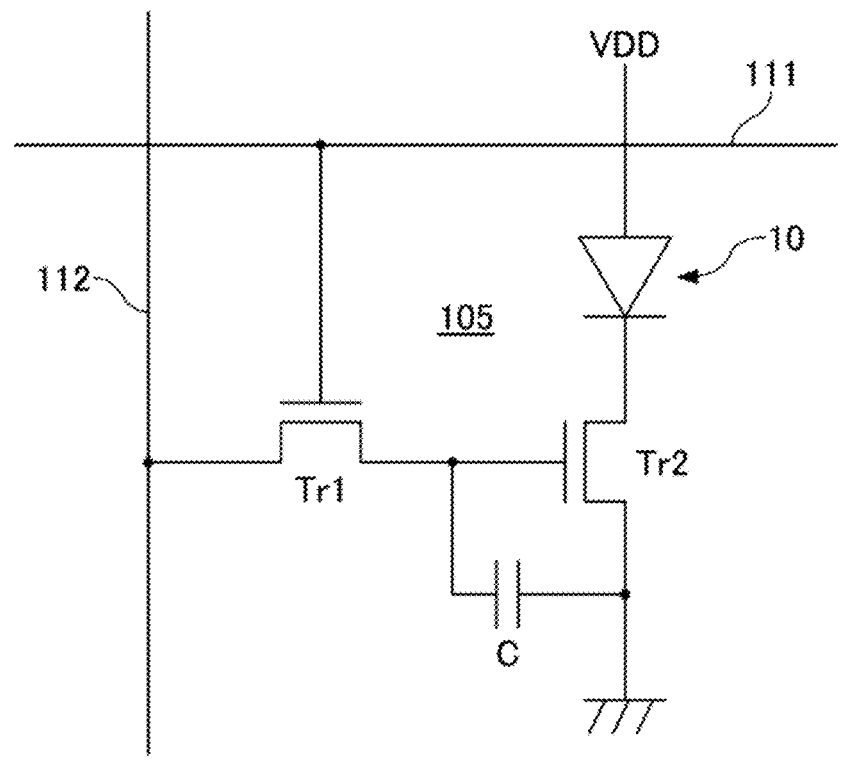
FIG. 14B is a circuit diagram of a driving cell of the flat panel display of FIG. 14A.

FIG. 14A and FIG. 14B are schematic diagrams of a flat panel display 100 using the photoelectronic device 10 (or the photoelectronic device 10A) of the embodiment as a light emitting diode. FIG. 14A is a schematic plan view of the active matrix circuit, and FIG. 14B is a circuit diagram of a display pixel.

The electron conducting layer 13 of the photoelectronic device 10 is an amorphous Zn—Si—O layer or a composite material layer in which ZnO crystal particles are dispersed in a Zn—Si—O matric (or base), having satisfactory flatness and uniformity. It is easily applied to a large-sized flat panel display 100.

The flat panel display 100 includes a device array 110 in which display pixels 105, each having a photoelectronic device 10, are arranged in a matrix, a gate line driver circuit 101 and a data line circuit 102 which are configured to drive the respective display pixels 105 of the device array 110. The gate line driver circuit 101 includes a shift register circuit and a clock control circuit. The data line driver circuit 102 includes a demultiplexer circuit. The plurality of gate lines 111 connected to the gate line driver circuit 101 are insulated from and orthogonally intersect the plurality of data lines 112 connected to the data line driver circuit 102 to configure the respective display pixels 105.

In FIG. 14B, the display pixel 105 includes at least a photoelectronic device 10 as a light emitting device, a select transistor Tr1, and a drive transistor Tr2. The anode (opposite electrode 17) of the photoelectronic device 10 is connected to the power supply voltage $V_{DD}$, and the cathode (transparent electrode 12) is connected to the ground level. A drive transistor Tr2 is arranged between the cathode of the photoelectronic device 10 and the ground, and the drain of the drive transistor Tr2 is connected to the cathode of the photoelectronic device 10.

The gate of the select transistor Tr1 is connected to the gate line 111, and the source is connected to the gate of the drive transistor Tr2 and the storage capacitor C. When the gate line 111 is selected, the select transistor Tr1 is turned on, and a voltage is applied to the gate of the drive transistor Tr2. Then the current corresponding to the capacitance of C (namely, corresponding to the gate-source voltage of the drive transistor Tr2) flows through the photoelectronic device 10, and the device emits light. In this example, the minimum circuit configuration having two transistors and one storage capacitor is illustrated as the driver circuit for the current-driven light emitting diode. However, as is well known in active matrix-driven organic EL displays, a circuit with a compensation function may be provided using additional transistors or capacitors.

The photoelectronic device 10 used in the flat panel display 100 is driven at a low voltage because of the reduced leakage current, and it has a steep emission spectrum with a narrow FWHM. Therefore, a vivid flat panel display 100 with low power consumption is achieved.

When the flat panel display 100 is a large-sized display with a diagonal of, for example, more than 50 inches, a back plane of the flat panel display 100 in which elements of each display pixel 105 such as the select transistor Tr1, the drive transistor Tr2, the storage capacitor C and the interconnects, as well as the gate lines 111 and the data line 112, are formed on a glass substrate, is first fabricated. Chips of the gate line driver circuit 101 and the data line driver circuit 102 formed of a plurality of silicon ICs are provided along the periphery of the glass substrate, and the gate line driver circuit 101 and the data line driver circuit 102 are connected to the gate lines 111 and the data lines 112, respectively. It is preferable to use a thin film transistor having an oxide semiconductor active layer such as amorphous In—Ga—Zn—O for the select transistor Tr1 and the drive transistor Tr2. Further, it is preferable to use low resistance copper interconnects in the respective pixels and for the matrix wirings.

Then, photoelectronic devices 10, each including a light emitting diode, are formed as a front plane, onto the backplane of the flat panel display 100, and is connected as illustrated in FIG. 14B. In the case of a large-sized display, the pixel size can be increased even when the total number of pixels is 8K or 4K. Therefore, the active layer 14 serving as the light emitting layer of the photoelectronic device 10 can be formed by a printing technique such as an inkjet method.

Meanwhile, when the active layer 14 is formed of, for example, a halide perovskite, three kinds of materials with the emission center wavelengths of R, G, and B can be prepared for the active layer 14, simply by changing the metal composition thereof. As has already been described above, the materials of these three different active layers 14 can be formed on the same ZSO layer having the same composition, and good band alignment can be obtained. A full-color flat panel display 100 can be easily fabricated by individually coating the three materials with different compositions for the active layers 14 by an inkjet method to form the front plane.

When the flat panel display 100 is a small-sized high-resolution display such as a smartphone screen, with a diagonal of several inches to 20 inches and with a resolution of more than 300 ppi, the active layer of the transistor in the display pixel 105 can be formed of not only the above-described oxide semiconductor, but also a low-temperature polysilicon. However, unlike a large-size display, it is difficult to mount the peripheral gate line driver circuit 101 and the data line driver circuit 102 as separate silicon ICs. These peripheral circuits have to be monolithically fabricated on a glass substrate, together with the transistors used in the respective pixels 105. When it is difficult for a higher-resolution device to separately form R, G, and B areas by a printing technique such as an inkjet method, full color may be achieved by an ordinary photolithography process.

When the flat panel display 100 is an ultra-high-resolution micro display with a diagonal of 1 inch or less and with a resolution of more than 2000 ppi, such as one used for an electronic viewfinder of a digital camera or goggles for augmented reality (AR), the entirety of the backplane is fabricated on a single crystal silicon wafer. In other words, all the transistors provided in the respective pixels and all the transistors provided in the peripheral circuits are formed as single crystal silicon transistors. Since it is difficult for such an ultra-high-resolution display to separately form R, G and B areas with different materials for the active layer 14, three kinds of materials for the active layer 14 may be mixed to acquire white light emission from the active layer 14. In this case, full color display can be achieved by providing color filters for selectively transmitting R, G, and B lights onto the photoelectronic device 10 with the white-light active layer 14.

The configuration of the first embodiment is not limited to the specifics of the above-described examples. The layer-averaged composition ratio Zn/(Si+Zn) of the electron conducting layer 13 is appropriately determined within the range greater than 70% and less than 85%, depending on the bandgap structure and/or the electron-hole balance of the active layer 14. Although in the embodiment the ZSO electron conducting layer 13 is formed on a glass substrate with ITO, it may be formed on a plastic substrate because a chemically stable transparent electron conducting layer 13 can be formed at room temperature. The hole transport layer 15 and the hole injection layer 16 are dispensable, and one or both of the hole transport layer 15 and the hole injection layer 16 may be omitted. Alternatively, a layer having both functions of the hole transport layer 15 and the hole injection layer 16 may be used. A forward stacked structure may be adopted as the device structure. In this case, the drive transistor Tr2 is inserted between the power supply voltage $V_{DD}$ and the anode of the light emitting device.

In any of the alternative configurations, by using the active layer containing inorganic particles and the electron conducting layer 13 of the embodiment, a photoelectronic device that exhibits good photoluminescence characteristic with reduced leakage current, which is operable at a low voltage, can be achieved.

In particular, the ZSO electron conducting layer 13 is chemically stable with respect to the solvent generally used for coating (for example, a solvent in which inorganic particles are dispersed), and has a conduction band level close to the conduction band level of a perovskite material or quantum dot. In addition, the ZSO electron conducting layer 13 has high transparency over the entire visible light region.

By adjusting the layer-averaged composition ratio Zn/(Si+Zn) to an appropriate value between 70% and 85%, the mobility or conductivity of the electron conducting layer 13 is controlled to maintain the electron-hole balance at an appropriate level.

Second Embodiment

Figure 15:
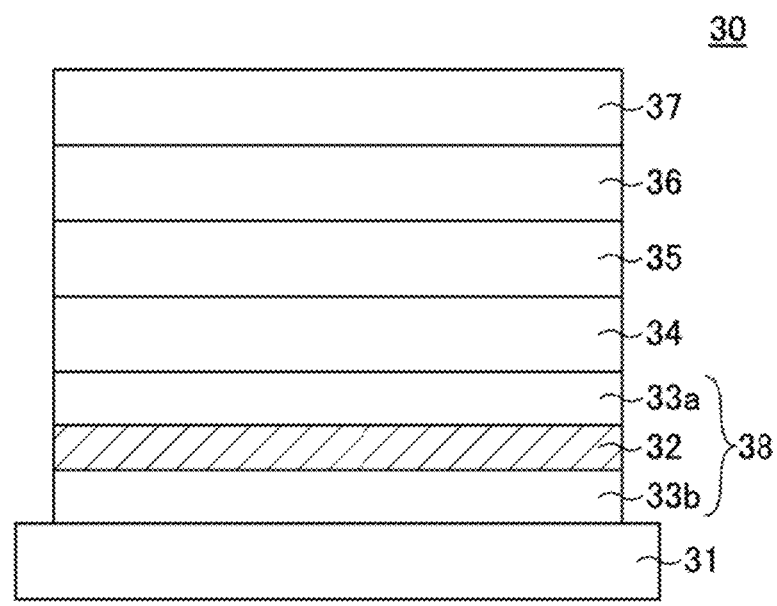
FIG. 15 is a schematic diagram of a photoelectronic device of the second embodiment.

FIG. 15 is a schematic diagram of a photoelectronic device 30 according to a second embodiment. In the second embodiment, ZSO is used as at least a part of the transparent electrode, making use of the good band alignment at the interface between the ZSO and the active layer containing an inorganic material.

An electrode of a typical transparent conductive oxide (TCO) such as ITO has a sheet resistance higher than a metal electrode. To ensure the conductivity, the thickness of a transparent electrode is increased. Increasing the thickness of the transparent electrode is not desirable from the viewpoint of reducing the size and the thickness of the device. A thick transparent electrode is also disadvantageous to flexibility of the whole device. Therefore, in the second embodiment, a multilayer transparent electrode is provided by using a ZSO film having a predetermined Zn ratio. The ZSO film serves as an electrode and also serves as an electron conducting layer provided in contact with the active layer.

The photoelectronic device 30 has a transparent electrode 38, an active layer 34, a hole transport layer 35, a hole injection layer 36, and a counterpart electrode 37 stacked in this order on a substrate 31. In this example, an inverted structure is adopted in which the transparent electrode 38 is the cathode and the counterpart electrode 37 is the anode. The transparent electrode 38 may be at a light extraction site or a light incident site.

The transparent electrode 38 has a three-layer structure in which a metal thin film 32 is provided between the first ZSO film 33*a* and the second ZSO film 33*b*. The first ZSO film 33*a* is in contact with the active layer 34 containing an inorganic material, and it functions as a part of the transparent electrode 38, and also as an electron conducting layer to supply electron to the active layer 34.

The second ZSO film 33*b* functions as a light extracting surface or a light incident surface of the transparent electrode 38. It also has a function of preventing penetration of moisture from the substrate 31. The metal thin film 32 is configured such that light of the operating wavelength is transmitted through, and that the conductivity of the transparent electrode 38 is improved. As will be described later, the thickness of the metal thin film 32 is 5 nm to 15 nm from the viewpoint of satisfying low sheet resistance and high transmittance. As the metal material, Ag, Au or the like can be used.

In the second embodiment, a flexible substrate is used as the substrate 31. The substrate 31 is a plastic substrate having high transparency with respect to the operating wavelength, using PET, PEN, transparent polyimide, etc. By providing the transparent electrode 38 having the metal thin film 32 on the flexible substrate 31, and providing the active layer 34 in contact with the first ZSO film 33*a*, the entire device can be made flexible while using an inorganic material for the active layer 34.

In the first ZSO film 33*a* serving as the electron conducting layer, the composition ratio of Zn to the total of Zn and Si (Zn/(Zn+Si)) is set in the optimum range, so as to have a low barrier to the active layer 34 and a high electron mobility. The optimum range of the Zn ratio is one that allows the band structure illustrated in FIG. 2 with respect to the energy band of the active layer 34, which range is for example, $$70\% < Zn/(Si+Zn) < 85\%.$$

When the active layer 34 is a light emitting layer, the first ZSO film 33*a* of the transparent electrode 38 serves as at least an electron injection layer or an electron transport layer. When the active layer 34 is a light absorption layer, the first ZSO film 33*a* serves as at least an electron extraction layer or an electron transport layer. The first ZSO film 33*a* may be amorphous, or in a mixed phase in which ZnO crystal particles are dispersed in the Zn—Si—O base matrix.

The active layer 34 contains inorganic particles. For example, polycrystal particles of a halide perovskite, or quantum dots of halide perovskite having a quantum confinement effect are contained. A coating-type active layer 34 is formed using an organic-inorganic hybrid material in which perovskite crystal particles or quantum dots are dispersed almost uniformly in an organic solvent.

As has been described in the first embodiment, by changing the composition of the inorganic material used in the active layer 34, without changing the composition of the first ZSO film 33*a*, devices corresponding to different wavelengths such as red, blue, or green can be fabricated.

The hole transport layer 35 may be any layer that has a hole transport function. From the viewpoint of the fabrication process, it is desirable that the hole transport layer is of a coating type and is provided in a layered structure. From the viewpoint of carrier mobility and electron confinement, as illustrated in FIG. 2, it is desirable that the maximum of the valence band level with respect to that of the active layer 34 is shallow and that the conduction band level is high. In one example, the hole transport layer 35 is formed of an arylamine compound, an amine compound containing a carbazole group, an amine compound containing a fluorene derivative, or the like.

The hole injection layer 36 may be any layer having a hole injection function. For example, an organic film such as copper phthalocyanine (CuPc) film or starburst amine film can be used. Alternatively, a thin film of metal oxide which includes one or more metals selected from molybdenum, tungsten, rhenium, vanadium, indium, tin, zinc, gallium, titanium or aluminum, may be used.

The hole injection layer 36 may be formed by a dry process such as a vapor deposition method or a transfer method, or it may be formed by a wet process such as a spin coating method or a spray coating method. The hole injection layer 36 and the hole transport layer 35 are not essential for the photoelectronic device 30, and at least one of them may be omitted.

The counterpart electrode 37 is a film of any conductive material including a metal, a carbon material, a metal oxide, a polymer, and so on. When the metal electrode is used, aluminum, silver, tin, gold, carbon, iron, cobalt, nickel, copper, zinc, tungsten, vanadium, or an alloy thereof may be used.

The optoelectronic device 30 of FIG. 15 is fabricated by the following process, for example. As the substrate 31, a PEN film (product name "Q65H") having a thickness of 50 μm manufactured by Teijin Film Solutions Co., Ltd. is used. A second ZSO film 33*b* is formed on the PEN film by a sputtering method at the RF power of, for example, 80 W.

Then, a thin film 32 of, for example, Ag is formed on the second ZSO film 33*b* by resistance heating vapor deposition. The film growth rate is 0.3 nm/s in this example.

Then, the first ZSO film 33*a* is formed on the Ag thin film 32 by a sputtering method. The ratio between the ZnO target and the SiO$_2$ target is adjusted such that the Zn ratio of the ZSO film 33*a* reaches a desired value. The film is deposited at RF power of 80 W.

The active layer 34 is formed on the first ZSO film 33*a*. For example, a solution of halide perovskite particles or quantum dots dissolved in an organic solvent is applied by spin coating. Then, an NPD having a thickness of 40 nm is formed on the active layer 34 by resistance heating vapor deposition, which is used as the hole transport layer 35. Then, molybdenum oxide (MoO$_x$) having a thickness of 7 nm is formed on the NPD by resistance heating vapor deposition to form a hole injection layer 36. Finally, an Ag film with a thickness of 100 nm is formed by resistance heating vapor deposition to form a counterpart electrode 37.

Figure 16A:
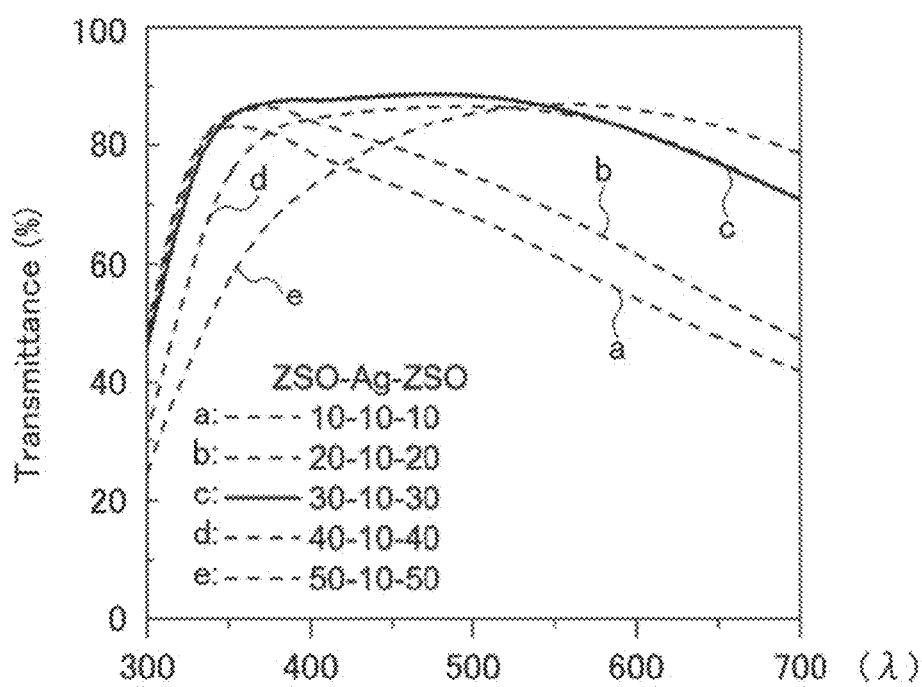
FIG. 16A shows film thickness dependence of the optical characteristic of a transparent electrode using a ZSO film.
Figure 16B:
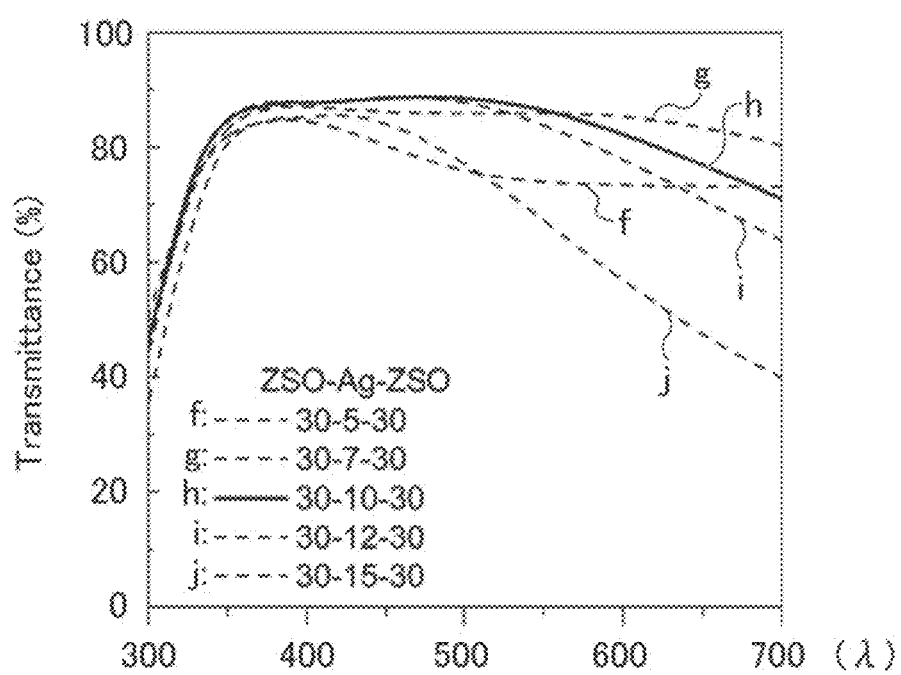
FIG. 16B shows film thickness dependence of the optical characteristic of a transparent electrode using a ZSO film.

FIG. 16A and FIG. 16B show the film thickness dependence of the optical characteristics of the transparent electrode 38 using the ZSO film. The horizontal axis represents wavelength and the vertical axis represent transmittance. The transmittance is plotted as a function of wavelength by changing the thickness of the respective layers of the ZSO-metal-ZSO three-layer structure of the transparent electrode 38. In the samples, Ag is used as the metal thin film 32.

In FIG. 16A, the thickness of the Ag thin film is fixed at 10 nm, and the thicknesses of the first ZSO layer 33a and the second ZSO layer 33b are changed in the range from 10 nm to 50 nm. When the thickness of the first ZSO layer 33a and the second ZSO layer 33b is 30 nm, with the Ag thin film having a thickness of 10 nm between them, relatively high transmittance is achieved over a wide wavelength range.

In FIG. 16B, the thickness of the first ZSO layer 33a and the second ZSO layer 33b is fixed at 30 nm, and the thickness of the Ag thin film varies within the range from 5 nm to 15 nm. When the Ag thin film is 7 nm to 12 nm, relatively high transmittance is achieved over a wide wavelength range. When the Ag thin film is 5 nm or 15 nm, a relatively high transmittance is achieved in the blue wavelength band, but the transmittance decreases in the longer wavelength band.

Figure 17:
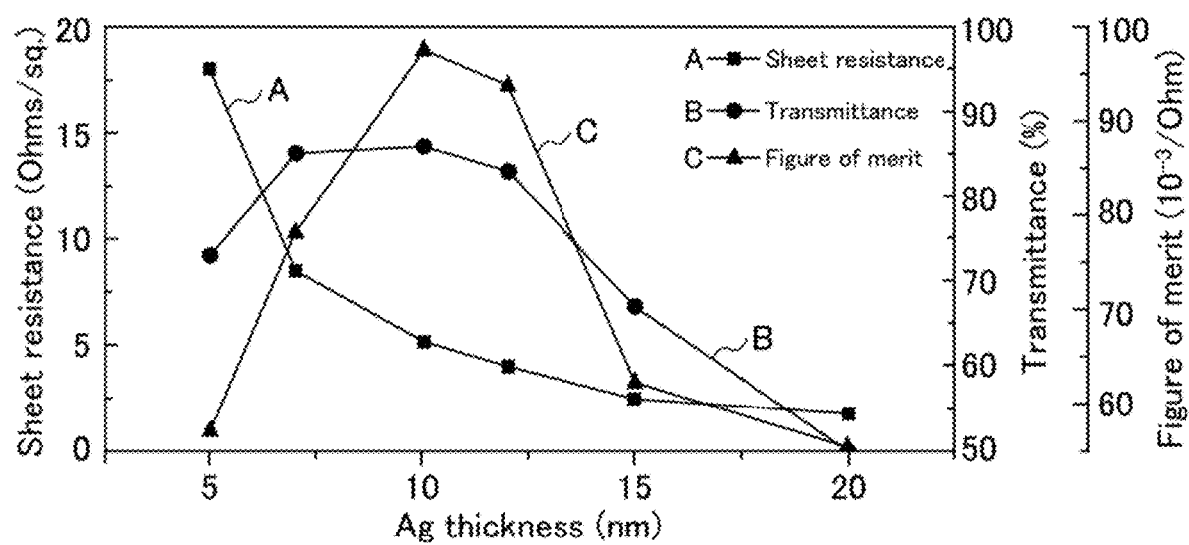
FIG. 17 shows film thickness dependence of the optical and electrical characteristics of a metal thin film used in a transparent electrode of the second embodiment.

FIG. 17 shows the film thickness dependence of the optical and electrical characteristics of the Ag thin film used in the transparent electrode 38. The horizontal axis represents thickness of the Ag thin film, the left vertical axis represents sheet resistance, and the right vertical axis represents transmittance. The bar on the far right of the page shows figure of merit. The figure of merit represents a value of $\sigma_{dc}/\sigma_{opt}(\omega)$ determined when the relationship between transmittance T and sheet resistance $R_s$ is expressed as $$T(\omega)=[1+(Z_0/2Rs)(\sigma_{opt}(\omega)/\sigma_{dc})]^{-2},$$

where $Z_0$ denotes the impedance (about 377Ω) of the vacuum, $\sigma_{dc}$ denotes the DC conductivity, and $\sigma_{opt}(\omega)$ denotes the optical conductivity at frequency ω of light. The frequency value ω is one at a wavelength of 550 nm.

The sheet resistance of the Ag thin film decreases as the thickness of the Ag thin film increases. On the other hand, the transmittance is acceptable when the thickness "t" of the Ag thin film is within the range 5 nm<t<15 nm, more preferably, 6 nm≤t≤13 nm.

The figure of merit is also acceptable within the rage 5 nm<t<15 nm, more preferably, 6 nm≤t≤13 nm.

With reference to the results of FIG. 17, FIG. 16A and FIG. 16B, the thickness "t" of the Ag thin film used in the transparent electrode 38 is preferably 5 nm<t<15 nm, and more preferably, 6 nm≤t≤13 nm, while the thickness of ZSO is set to 30 nm to 40 nm. For example, when the thickness of the ZSO—Ag—ZSO structure is set to 30-10-30 nm, the total thickness of the transparent electrode 38 is 70 nm, and thus, the flexibility of the device fabricated on a plastic substrate is maintained.

The thickness of the first ZSO film 33a of the transparent electrode 38, which is in contact with the active layer 34, may be increased to about 100 nm. In the transparent electrode 38 as a whole, the thickness is maintained small, the sheet resistance is reduced owing to the Ag thin film, and the electron injection/transport function is ensured by the first ZSO layer 33a.

Figure 18:
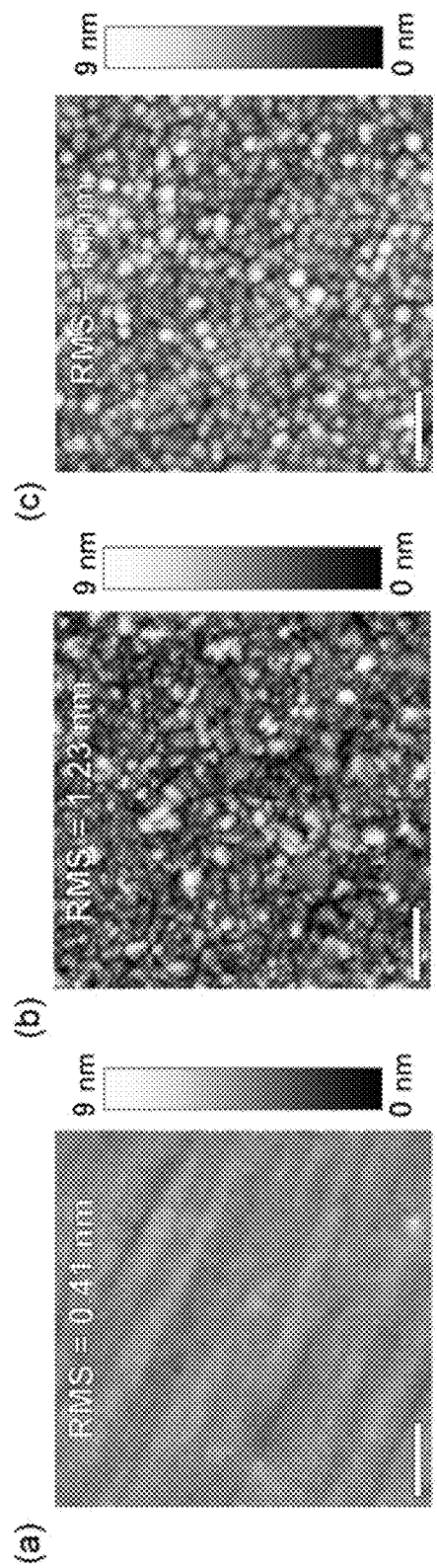
FIG. 18 shows atomic force microscopy (AFM) images of the respective layers of a transparent electrode with a three-layer structure.

FIG. 18 shows AFM images of the respective layers of the three-layer structure of the transparent electrode 38. Image (a) shows the surface of a second ZSO film 33b having a thickness of 30 nm and formed on a plastic substrate by sputtering. The RMS value indicating the surface roughness is as small as 0.41 nm, and a flat surface is obtained.

Image (b) of FIG. 18 shows the surface of the Ag thin film 32 having a thickness of 10 nm and formed on the second ZSO film 33b by vapor deposition. The RMS of the Ag thin film is maintained as low as 1.23 nm.

Image (c) of FIG. 18 shows the surface of a first ZSO film 33a having a thickness of 30 nm and formed on the Ag thin film 32 by sputtering. The RMA decreases to 1.1 nm. It is understood that the ZSO sputtered film covers the unevenness on the Ag surface.

The transparent electrode 38 with a three-layer structure of ZSO-metal-ZSO has sufficient surface flatness.

<Bending Resistance>

Next, the bending characteristics of the transparent electrode 38 are examined.

Figure 19A:
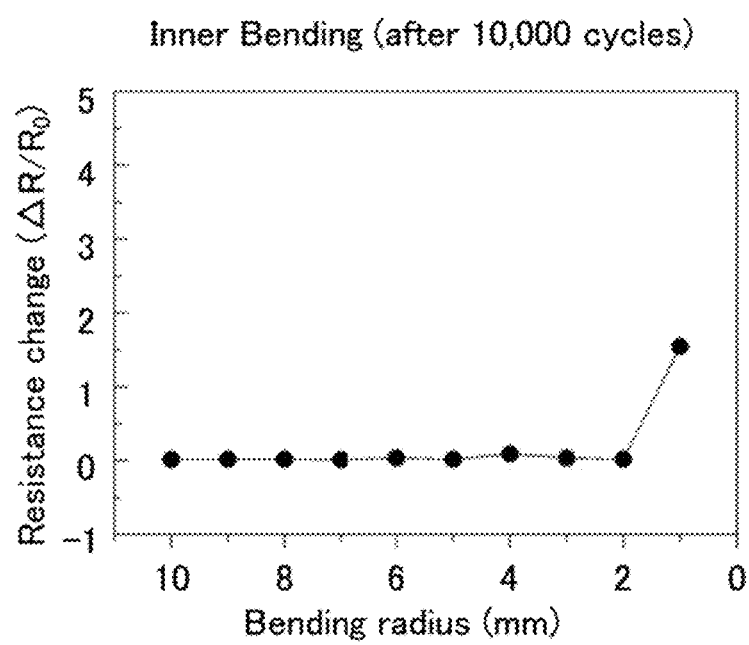
FIG. 19A shows a bending characteristic of a photoelectronic device of the second embodiment.
Figure 19B:
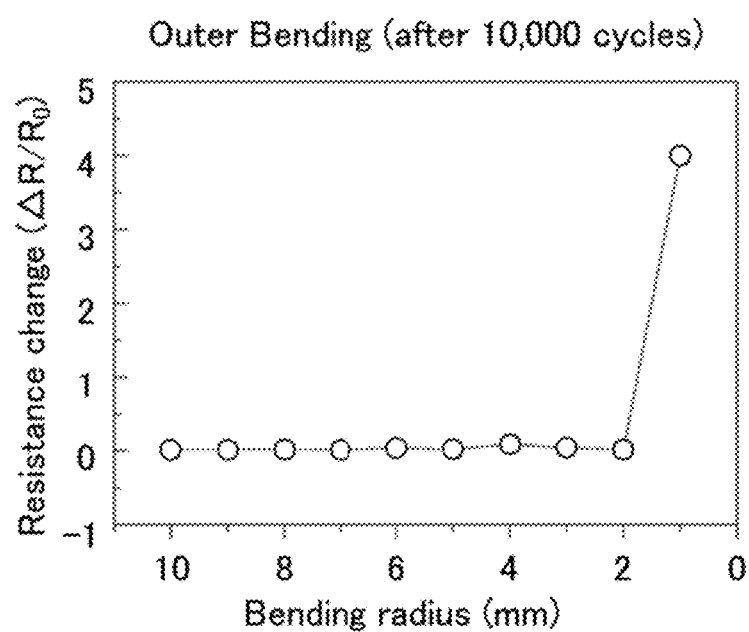
FIG. 19B shows a bending characteristic of a photoelectronic device of the second embodiment.

FIG. 19A and FIG. 19B are diagrams showing bending characteristics of the transparent electrode 38 of the second embodiment. FIG. 19A shows the inner bending characteristic after 10,000 cycles, where the device is bent upward in a U shape in the layered direction. FIG. 19B shows the outer bending characteristic after 10,000 cycles, where the ends of the device are bent downward in an inverted U shape. In both FIG. 19A and FIG. 19B, the horizontal axis represents the bending radius (mm), and the vertical axis represents the resistance change from the initial value.

As to the inner bending of FIG. 19A, the resistance does not change even though the bending radius is reduced to 2 mm after 10,000 cycles. In the outer bending of FIG. 19B also, the resistance does not change even though the bending radius is reduced to 2 mm after 10,000 cycles.

Figure 20:
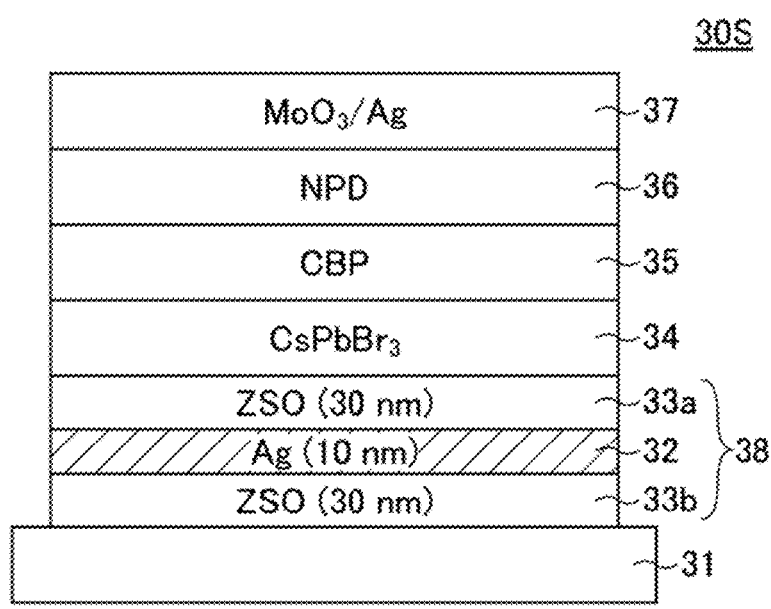
FIG. 20 is a schematic diagram of a sample of the photoelectronic device of the second embodiment.
Figure 21A:
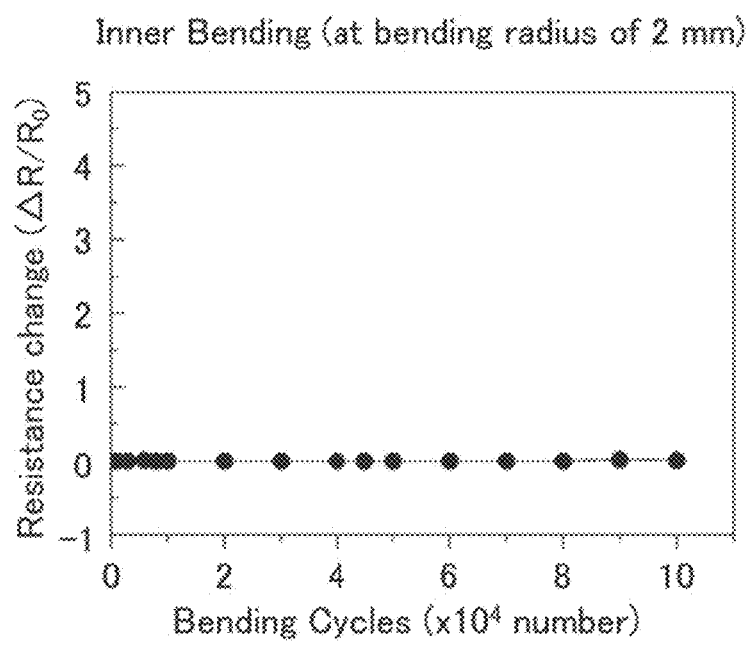
FIG. 21A shows a bending characteristic of the sample of the photoelectronic device of the second embodiment.
Figure 21B:
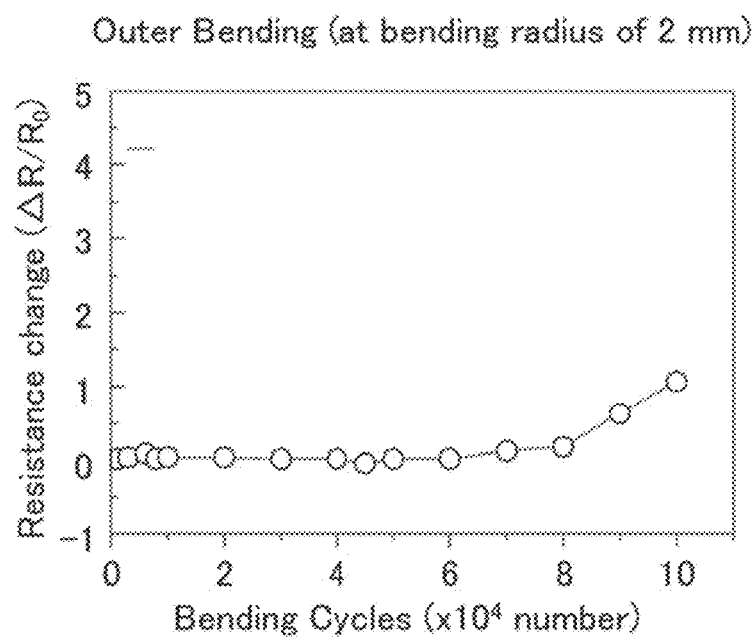
FIG. 21B shows a bending characteristic of the sample of the photoelectronic device of the second embodiment.

FIG. 21A and FIG. 21B show other test results using a sample 30S illustrated in FIG. 20. In this test, the bending radius is fixed at 2 mm, and the bending cycle is increased. In the inner bending of FIG. 21A, the resistance does not change even though a cycle with a large bending is repeated as many as $10 \times 10^4$ cycles. In the outer bending of FIG. 21B also, almost no change in resistance occurs even though the same bending cycle is repeated up to $8 \times 10^4$ cycles, exhibiting a sufficiently high bending resistance.

Figure 22:
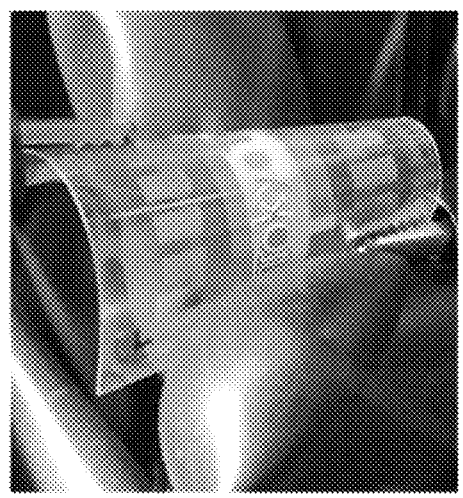
FIG. 22 is an image showing a high flexibility of the fabricated sample.

FIG. 22 is an image of the fabricated sample 30S. Green light is emitted from the greatly bent PEM film. Thus, both flexibility and reliability of light emission are acquired at the same time.

<Electric and Optical Characteristics>

Figure 23:
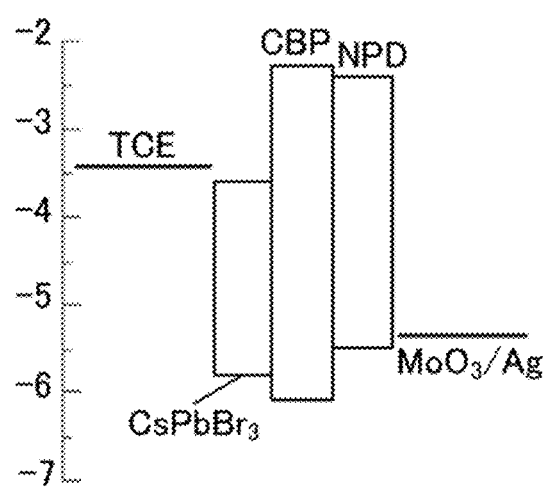
FIG. 23 shows an energy band structure of the fabricated sample.

FIG. 23 illustrates an energy band structure of the fabricated sample 30S of FIG. 20. The energy level of the transparent electrode 38 is labelled as "TCE" which stands for transparent conductive electrode, and the energy level of the counterpart electrode layer 47 is labeled as "$MoO_3$/Ag". Between the TCE and $MoO_3$ Ag are provided "$CsPbBr_3$", "CBP", and "NPD" in this order.

The energy level of TEC is at the same level as, or slightly higher than, the conduction band of $CsPbBr_3$, and electrons move efficiently to $CsPbBr_3$. The conduction band of CBP is a high barrier to the electrons injected into $CsPbBr_3$, and it blocks the electrons to confine the carriers.

The level of the valence band of CBP is deeper than the maximum level of the valence band of $CsPbBr_3$, and holes efficiently move to $CsPbBr_3$. The valence band of CBP is not a high barrier to the holes injected into NPD from $MoO_3$/Ag. The injected holes easily overcome the CBP barrier and moves to $CsPbBr_3$. The electrons and holes confined in $CsPbBr_3$ recombine and emit light.

When $CsPbBr_3$ is used as the light absorption layer, electrons and holes generated by light absorption are easily extracted to the TCE and $MoO_3$/Ag, respectively.

Figure 24:
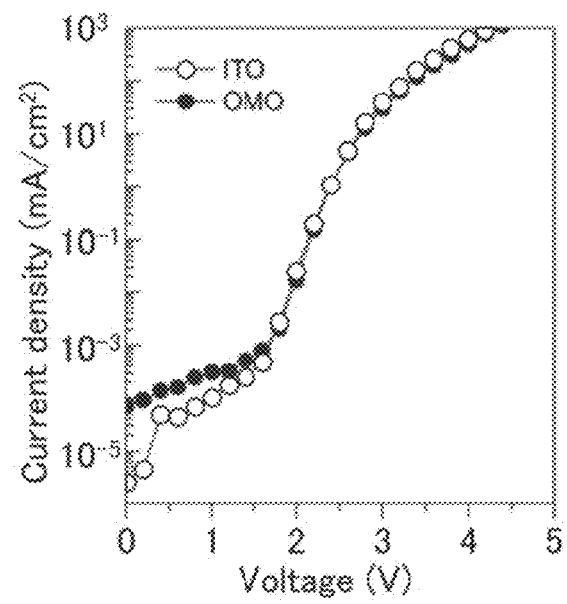
FIG. 24 shows a current characteristic of the device using the transparent electrode of the second embodiment, together with that of the device of the first embodiment.

FIG. 24 shows voltage-current characteristic of photoelectronic device 30 of the second embodiment. In the figure, the closed circles labeled as "OMO" plot the characteristic of the photoelectronic device 30 using the transparent electrode 38 with a three-layer structure. The sample 30S of FIG. 20 is used for the measurement. For the reference, the voltage-current characteristic of the photoelectronic device 10 of the first embodiment is also shown by open circles. In the sample of the first embodiment, a ZSO film is inserted as an electron conducting layer 13 between the ITO electrode and the coating layer of $CsPbBr_3$. This plot is labeled as "ITO".

Using the transparent electrode 38 with a three-layer structure, a voltage-current characteristic as good as that of the photoelectronic device 10 of the first embodiment is obtained. The leakage current is also very low, $10^{-4}$ $mA/cm^2$.

Figure 25:
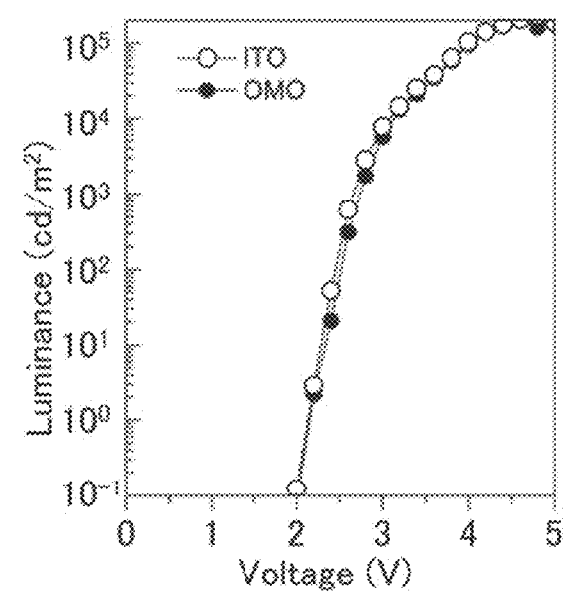
FIG. 25 shows a luminance characteristic of the device using the transparent electrode of the second embodiment, together with that of the device of the first embodiment.

FIG. 25 shows a luminance characteristic of the photoelectronic device 30 of the second embodiment. In the figure, the closed circles labeled as "OMO" plot the characteristic of the photoelectronic device 30 using the transparent electrode 38 with the three-layer structure. The sample 30S of FIG. 20 is used for the measurement. For the reference, the open circles labeled as "ITO" plot the luminance characteristic of the sample of the first embodiment.

Using the transparent electrode 38 having a three-layer structure, a luminance characteristic as superior as that of the photoelectronic device 10 of the first embodiment is obtained. At a low voltage of about 3 V, a high luminance exceeding $10^4$ $cd/m^2$ is obtained.

Figure 26:
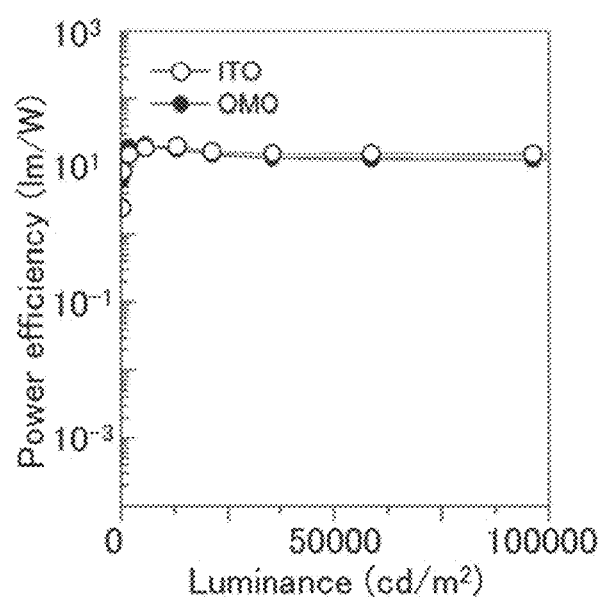
FIG. 26 shows a power efficiency of the device using the transparent electrode of the second embodiment, together with that of the device of the first embodiment.

FIG. 26 shows power efficiency of the photoelectronic device 30 of the second embodiment. In the figure, the closed circles labeled as "OMO" plot the power efficiency of the photoelectronic device 30 using the transparent electrode 38 with a three-layer structure. The sample 30S of FIG. 20 is used for the measurement. For the reference, the open circles labeled as "ITO" plot the power efficiency of the sample of the first embodiment.

Using the transparent electrode 38 having a three-layer structure, a power efficiency as high as that of the photoelectronic device 10 of the first embodiment is obtained. With a steep rise, a power efficiency of several tens of lm/W is obtained.

By applying ZSO with a Zn content of a predetermined range to the transparent electrode in this manner, a photoelectronic device with excellent electrical and optical characteristics can be implemented. The optoelectronic device of the second embodiment is applicable to the flat panel display of FIG. 14 in the same manner as the optoelectronic device of the first embodiment. Perovskite coating layers having different compositions can be applied directly onto the same ZSO transparent electrode of the three-layer structure, and light emission of different colors can be obtained.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present invention have been described in detail, it should be understood that the various changes, substitutions, and alterations could be made hereto without departing from the spirit and scope of the invention.

What is claimed is:

1. A photoelectronic device comprising:
an active layer containing inorganic particles; and
an oxide semiconductor layer containing zinc (Zn), Silicon (Si) and oxygen (O), where the oxide semiconductor layer and the active layer are stacked layers,
wherein the photoelectronic device further comprises a multilayer transparent electrode provided over or under the active layer, wherein the oxide semiconductor layer serves as a part of the multilayer transparent electrode.

2. A photoelectronic device comprising:
an active layer containing inorganic particles; and
an oxide semiconductor layer containing zinc (Zn), silicon (Si) and oxygen (O), where the oxide semiconductor layer and the active layer are stacked layers,
wherein an ohmic electrical contact is presented between the active layer and the oxide semiconductor layer, and
wherein a layer-averaged composition ratio Zn/(Si+Zn) of the oxide semiconductor layer is $0.7<Zn/(Si+Zn)<0.85$.

3. The photoelectronic device as claimed in claim 1, wherein a layer-averaged composition ratio Zn/(Si+Zn) of the oxide semiconductor layer is $0.7<Zn/(Si+Zn)<0.85$.

4. The photoelectronic device as claimed in claim 2, further comprising:
a transparent electrode provided over or under the active layer,
wherein the oxide semiconductor layer is an electron conducting layer provided between the active layer and the transparent electrode.

5. The photoelectronic device as claimed in claim 2, further comprising:
a multilayer transparent electrode provided over or under the active layer,
wherein the oxide semiconductor layer is a part of the multilayer transparent electrode.

6. The photoelectronic device as claimed in claim 5, wherein the multilayer transparent electrode has a second oxide semiconductor layer, a metal thin film, and a first oxide semiconductor layer stacked in this order, and
wherein the oxide semiconductor layer is the first oxide semiconductor layer and is in ohmic contact with the active layer.

7. The photoelectronic device as claimed in claim 1, wherein the multilayer transparent electrode includes a second oxide semiconductor layer, a metal thin film, and a first oxide semiconductor layer stacked in this order, and
wherein the oxide semiconductor layer is the first oxide semiconductor layer and is in ohmic contact with the active layer.

8. The photoelectronic device as claimed in claim 1, wherein the inorganic particles are quantum dots having a quantum confinement effect, or halogen compound particles.

9. The photoelectronic device as claimed in claim 2, wherein the inorganic particles are quantum dots having a quantum confinement effect, or halogen compound particles.

10. The photoelectronic device as claimed in claim 1, wherein the oxide semiconductor layer is a composite material layer in which ZnO crystal particles are dispersed in a Zn—Si—O matrix, or is an amorphous layer of Zn—Si—O.

11. The photoelectronic device as claimed in claim 2, wherein the oxide semiconductor layer is a composite material layer in which ZnO crystal particles are dispersed in a Zn—Si—O matrix, or is an amorphous layer of Zn—Si—O.

12. The photoelectronic device as claimed in claim 1, wherein the active layer is a light emitting layer, and the oxide semiconductor layer serves as one or both of an election injection layer and an electron transport layer.

13. The photoelectronic device as claimed in claim 2, wherein the active layer is a light emitting layer, and the oxide semiconductor layer serves as one or both of an electron injection layer and an electron transport layer.

14. The photoelectronic device as claimed in claim 1, wherein the active layer is a light receiving layer, and the oxide semiconductor layer serves as one or both of an electron extraction layer and an electron transport layer.

15. The photoelectronic device as claimed in claim 2, wherein the active layer is a light receiving layer, and the oxide semiconductor layer serves as one or both of an electron extraction layer and an electron transport layer.

16. A flat panel display comprising:
a device array in which plurality of the photoelectronic devices as claimed in claim 12 are arranged in an array, and
a driver circuit configured to drive the device array.

17. A flat panel display comprising:
a device array in which plurality of the photoelectronic devices as claimed in claim 13 are arranged in an array, and
a driver circuit configured to drive the device array.

18. A fabrication method of a photoelectronic device, comprising:
forming an active layer by applying a solution in which a halogen compound or a quantum dot having a quantum confinement effect is dispersed onto an underlayer;
forming an oxide semiconductor layer containing zinc (Zn), silicon (Si) and oxygen (O) to provide stacked layers of the oxide semiconductor layer and the active layer; and
providing a multilayer transparent electrode over or under the active layer,
wherein the oxide semiconductor layer is formed as a part of the multilayer structure of the transparent electrode.

19. A fabrication method of a photoelectronic device, comprising:
forming an active layer by applying a solution in which a halogen compound or a quantum dot having a quantum confinement effect is dispersed onto an underlayer; and
forming an oxide semiconductor layer containing zinc (Zn), silicon (Si) and oxygen (O) to provide stacked layers of the active layer and the oxide semiconductor layer;
wherein the active layer and the oxide semiconductor layer are stacked such that an ohmic electric contact is presented therebetween, and
wherein a layer-averaged composition ratio $Zn/(Si+Zn)$ of the oxide semiconductor layer is set within a range $0.7<Zn/(Si+Zn)<0.85$.

* * * * *